United States Patent
Lin et al.

(10) Patent No.: US 8,298,868 B2
(45) Date of Patent: Oct. 30, 2012

(54) METHOD OF MAKING A SEMICONDUCTOR CHIP ASSEMBLY WITH A POST/BASE HEAT SPREADER AND A PLATED THROUGH-HOLE

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 13/079,044

(22) Filed: Apr. 4, 2011

(65) Prior Publication Data
US 2011/0183472 A1      Jul. 28, 2011

Related U.S. Application Data

(60) Division of application No. 13/078,928, filed on Apr. 2, 2011, now Pat. No. 8,129,742, which is a continuation-in-part of application No. 12/616,773, filed on Nov. 11, 2009, now Pat. No. 8,067,784, and a continuation-in-part of application No. 12/616,775, filed on Nov. 11, 2009, which is a continuation-in-part of application No. 12/557,540, filed on Sep. 11, 2009, and a continuation-in-part of application No. 12/557,541, filed on Sep. 11, 2009, now Pat. No. 7,948,076, which is a continuation-in-part of application No. 12/406,510, filed on Mar. 18, 2009.

(60) Provisional application No. 61/322,911, filed on Apr. 12, 2010, provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
*H01L 21/00* (2006.01)
*H01L 23/12* (2006.01)

(52) U.S. Cl. ... 438/122; 438/26; 257/711; 257/E33.056; 257/E23.104; 257/E33.075

(58) Field of Classification Search ......... 438/106–127, 438/26, 29; 257/99, 712, 676
See application file for complete search history.

(56) References Cited

U.S. PATENT DOCUMENTS
3,689,993 A   9/1972   Tolar .............................. 438/380
(Continued)

FOREIGN PATENT DOCUMENTS
JP    2005-166775    6/2005

*Primary Examiner* — Jenny L Wagner
*Assistant Examiner* — Abbigale Boyle
(74) *Attorney, Agent, or Firm* — Jackson IPG PLLC

(57) ABSTRACT

A method of making a semiconductor chip assembly includes providing a post and a base, mounting an adhesive on the base including inserting the post into an opening in the adhesive, mounting a conductive layer on the adhesive including aligning the post with an aperture in the conductive layer, then flowing the adhesive upward between the post and the conductive layer, solidifying the adhesive, then providing a conductive trace that includes a pad, a terminal, a plated through-hole and a selected portion of the conductive layer, mounting a semiconductor device on the post, wherein a heat spreader includes the post and the base, electrically connecting the semiconductor device to the conductive trace and thermally connecting the semiconductor device to the heat spreader.

25 Claims, 27 Drawing Sheets

U.S. PATENT DOCUMENTS

| | | | |
|---|---|---|---|
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A | 5/2000 | Lau et al. | 257/738 |
| 6,107,683 A | 8/2000 | Castro et al. | 257/700 |
| 6,160,705 A | 12/2000 | Stearns et al. | 361/704 |
| 6,162,664 A | 12/2000 | Kim | 438/126 |
| 6,281,568 B1 | 8/2001 | Glenn et al. | 257/684 |
| 6,313,525 B1 | 11/2001 | Sasano | 257/704 |
| 6,453,549 B1 | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 * | 1/2003 | Juskey et al. | 257/706 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |
| 6,608,376 B1 | 8/2003 | Liew et al. | 257/698 |
| 6,625,028 B1 | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,720,651 B2 * | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,900,535 B2 | 5/2005 | Zhou | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,196,403 B2 | 3/2007 | Karim | 257/675 |
| 7,335,522 B2 | 2/2008 | Wang et al. | 438/26 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 | 1/2010 | Lin et al. | 438/127 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,956,372 B2 | 6/2011 | Kamada et al. | 257/98 |
| 8,030,676 B2 | 10/2011 | Lin | 257/99 |
| 8,071,998 B2 | 12/2011 | Chen | 257/99 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2005/0277227 A1 * | 12/2005 | Shim et al. | 438/108 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0126093 A1 * | 6/2007 | Ho et al. | 257/675 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0128739 A1 * | 6/2008 | Sanpei et al. | 257/99 |
| 2008/0173884 A1 * | 7/2008 | Chitnis et al. | 257/98 |
| 2008/0180824 A1 | 7/2008 | Endoh et al. | 359/894 |
| 2009/0309213 A1 | 12/2009 | Takahashi et al. | 257/707 |
| 2010/0149756 A1 | 6/2010 | Rowcliffe et al. | 361/714 |
| 2010/0291737 A1 | 11/2010 | Ikeguchi et al. | 438/108 |
| 2011/0133204 A1 | 6/2011 | Lai | 257/76 |

* cited by examiner

METHOD OF MAKING A SEMICONDUCTOR CHIP ASSEMBLY WITH A POST/BASE HEAT SPREADER AND A PLATED THROUGH-HOLE

CROSS-REFERENCE TO RELATED APPLICATIONS

This application is a divisional of U.S. application Ser. No. 13/078,928 filed Apr. 2, 2011 now U.S. Pat. No. 8,129,742, which is a continuation-in-part of U.S. application Ser. No. 12/616,773 filed Nov. 11, 2009 now U.S. Pat. No. 8,067,784 and a continuation-in-part of U.S. application Ser. No. 12/616,775 filed Nov. 11, 2009, each of which is incorporated by reference. U.S. application Ser. No. 13/078,928 filed Apr. 2, 2011 also claims the benefit of U.S. Provisional Application Ser. No. 61/322,911 filed Apr. 12, 2010, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009 now U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The heat spreader includes a post and a base. The conductive trace includes a pad, a terminal and a plated through-hole. The semiconductor device is electrically connected to the conductive trace and thermally connected to the heat spreader. The post extends upwardly from the base into an opening in the adhesive, and the base extends laterally from the post. The conductive trace provides signal routing between the pad and the terminal using the plated through-hole.

In accordance with an aspect of the present invention, a semiconductor chip assembly includes a semiconductor device, an adhesive, a heat spreader and a conductive trace. The adhesive includes an opening. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The conductive trace includes a pad, a terminal and a plated through-hole, wherein the plated through-hole extends below the pad and above the terminal and is in an electrically conductive path between the pad and the terminal.

The semiconductor device overlaps the post, is electrically connected to the pad and thereby electrically connected to the terminal, and is thermally connected to the post and thereby thermally connected to the base. The adhesive is mounted on and extends above the base, extends laterally from the post to or beyond the terminal and is sandwiched between the base and the pad. The post extends into the opening and the base and the terminal have the same thickness and are coplanar with one another.

The conductive trace can include a routing line, the pad and the routing line can overlap the adhesive and the routing line can be in an electrically conductive path between the pad and the plated through-hole.

In accordance with another aspect of the present invention, a semiconductor chip assembly includes a semiconductor device, an adhesive, a heat spreader, a substrate and a conductive trace. The adhesive includes an opening. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The substrate includes a dielectric layer, and an aperture extends through the substrate. The conductive trace includes a pad, a terminal and a plated through-hole, wherein the plated through-hole extends below the pad and above the terminal and an electrically conductive path between the pad and the terminal includes the plated through-hole.

The semiconductor device overlaps the post, is electrically connected to the pad and thereby electrically connected to the terminal, and is thermally connected to the post and thereby thermally connected to the base. The adhesive is mounted on and extends above the base and the terminal, extends between the post and the substrate, extends between the post and the plated through-hole, extends laterally from the post to or beyond the terminal and is sandwiched between the post and the dielectric layer, between the base and the dielectric layer and between the terminal and the dielectric layer. The substrate is mounted on the adhesive and extends above the base and the terminal. The post extends into the opening and the aperture, the plated through-hole extends above and below the dielectric layer and the base and the terminal have the same thickness and are coplanar with one another.

The heat spreader can include a cap that extends above and is adjacent to and covers in the upward direction and extends laterally from a top of the post. For instance, the cap can have a rectangular or square shape and the top of the post can have a circular shape. In this instance, the cap can be sized and shaped to accommodate a thermal contact surface of the semiconductor device whereas the top of the post is not sized and shaped to accommodate the thermal contact surface of the semiconductor device. The cap can also contact and overlap a portion of the adhesive that is coplanar with and adjacent to the post. The cap can also contact and overlap the dielectric layer. The cap can also be coplanar with the pad above the adhesive and the dielectric layer. Furthermore, the cap and the pad can have the same thickness where closest to one another and different thickness where the cap is adjacent to the post. In addition, the cap can be thermally connected to the base by the post.

The heat spreader can consist of the post and the base or the post, the base and the cap. The heat spreader can also consist essentially of copper, aluminum or copper/nickel/aluminum. The heat spreader can also consist of a buried copper, aluminum or copper/nickel/aluminum core and plated surface contacts that consist of gold, silver and/or nickel. In any case, the heat spreader provides heat dissipation and spreading from the semiconductor device to the next level assembly.

The semiconductor device can be mounted on the heat spreader and the conductive trace. For instance, the semiconductor device can be mounted on and overlap the post and the pad, be electrically connected to the pad using a first solder joint and be thermally connected to the heat spreader using a second solder joint. Alternatively, the semiconductor device can be mounted on and overlap the post but not the conductive trace, be electrically connected to the pad using a wire bond and be thermally connected to the heat spreader using a die attach.

The semiconductor device can be a packaged or unpackaged semiconductor chip. For instance, the semiconductor device can be an LED package that includes an LED chip, is mounted on the cap and the pad, overlaps the post and the pad, is electrically connected to the pad using a first solder joint and is thermally connected to the cap using a second solder joint. Alternatively, the semiconductor device can be a semiconductor chip such as an LED chip that is mounted on the cap but not the pad, overlaps the post but not the pad, is electrically connected to the pad using a wire bond and is thermally connected to the cap using a die attach.

The adhesive can contact the post and the dielectric layer in a gap in the aperture between the post and the substrate, extend across the dielectric layer in the gap and contact the base, the dielectric layer, the terminal and the plated through-hole outside the gap. The adhesive can also cover and surround the post in the lateral directions, cover the base outside the post in the upward direction and cover the cap outside the post in the downward direction. The adhesive can also conformally coat the sidewalls of the post and top surface portions of the base and the terminal. The adhesive can also fill the space between the post and the dielectric layer and between the base and the substrate.

The adhesive can extend laterally from the post to or beyond the terminal. For instance, the adhesive and the terminal can extend to peripheral edges of the assembly. In this instance, the adhesive extends laterally from the post to the terminal. Alternatively, the adhesive can extend to peripheral edges of the assembly and the terminal can be spaced from the peripheral edges of the assembly. In this instance, the adhesive extends laterally from the post beyond the terminal.

The adhesive alone can intersect an imaginary horizontal line between the post and the dielectric layer, an imaginary horizontal line between the post and the plated through-hole, an imaginary vertical line between the base and the cap, an imaginary vertical line between the base and the dielectric layer and an imaginary vertical line between the terminal and the dielectric layer.

The post can be integral with the base. For instance, the post and the base can be a single-piece metal or include a single-piece metal at their interface, and the single-piece metal can be copper. The post can also be coplanar with the adhesive above the dielectric layer at the cap and below the dielectric layer at the base. The post can also have a cut-off conical or pyramidal shape in which its diameter decreases as it extends upwardly from the base to its top.

The base can cover the post in the downward direction, support the substrate and the adhesive and be spaced from peripheral edges of the assembly.

The substrate can be spaced from the post, the base and the terminal. The substrate can also be a laminated structure.

The conductive trace can be spaced from the heat spreader. The pad can contact the dielectric layer and be spaced from the adhesive, the terminal can contact the adhesive and be spaced from the dielectric layer, and the plated through-hole can contact and extend through the adhesive and the dielectric layer and provide vertical signal routing between the pad and the terminal. Furthermore, the plated through-hole can extend to a peripheral edge of the assembly or be spaced from the peripheral edges of the assembly.

The conductive trace can consist of the pad, the terminal and the plated through-hole. The conductive trace can also consist essentially of copper. The conductive trace can also consist of a buried copper core and plated surface contacts that consist of gold, silver and/or nickel. In any case, the conductive trace provides signal routing between the pad and the terminal.

The pad can be an electrical contact for the semiconductor device, the terminal can be an electrical contact for the next level assembly, and the pad and the terminal can provide signal routing between the semiconductor device and the next level assembly.

The base, the cap, the pad, the terminal and the plated through-hole can be the same metals. For instance, the base, the cap, the pad, the terminal and the plated through-hole can include a gold, silver or nickel surface layer and a buried copper core and be primarily copper and the post can be copper. In this instance, a plated contact can include a gold or silver surface layer and a buried nickel layer that contacts and is sandwiched between the surface layer and the buried copper core or a nickel surface layer that contacts the buried copper core. Furthermore, the heat spreader can include a copper core shared by the post, the base and the cap and the conductive trace can include a copper core shared by the pad, the terminal and the plated through-hole. For instance, the heat spreader and the conductive trace can include a gold, silver or nickel surface layer and a buried copper core and be primarily copper. In this instance, the heat spreader can include a plated contact at the cap and spaced from the post and the base and another plated contact at the base and spaced from the post and the cap, and the conductive trace can include a plated contact at the pad, the terminal and the plated through-hole.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a post and a base, mounting an adhesive on the base including inserting the post into an opening in the adhesive, mounting a conductive layer on the adhesive including aligning the post with an aperture in the conductive layer, then flowing the adhesive upward between the post and the conductive layer, solidifying the adhesive, then providing a conductive trace that includes a pad, a terminal, a plated through-hole and a selected portion of the conductive layer, mounting a semiconductor device on the post, wherein a heat spreader includes the post and the base, electrically connecting the semiconductor device to the conductive trace and thermally connecting the semiconductor device to the heat spreader.

In accordance with an aspect of the present invention, a method of making a semiconductor chip assembly includes (1) providing a post, a base, an adhesive and a conductive layer, wherein (a) the post is adjacent to the base, extends above the base in an upward direction, extends into an opening in the adhesive and is aligned with an aperture in the conductive layer, (b) the base extends below the post in a downward direction opposite the upward direction and extends laterally from the post in lateral directions orthogonal to the upward and downward directions, (c) the adhesive is mounted on and extends above the base, is sandwiched between the base and the conductive layer and is non-solidified, and (d) the conductive layer is mounted on and extends above the adhesive, then (2) flowing the adhesive into and upward in a gap located in the aperture between the post and the conductive layer, (3) solidifying the adhesive, then (4) providing a plated through-hole, (5) providing a conductive trace that includes a pad, a terminal, the plated through-hole and a selected portion of the conductive layer, wherein an electrically conductive path between the pad and the terminal includes the plated through-hole, then (6) mounting a semiconductor device on the post, wherein a heat spreader includes the post and the base and the semiconductor device overlaps the post, (7) electrically connecting the semiconductor device to the pad, thereby electrically connecting the semiconductor device to the terminal, and (8) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing an adhesive, wherein an opening extends through the adhesive, (3) providing a conductive layer, wherein an aperture extends through the conductive layer, (4) mounting the adhesive on the base, including inserting the post into the opening, wherein the adhesive extends above the base and the post extends into the opening, (5) mounting the conductive layer on the adhesive, including aligning the post with the aperture, wherein the conductive layer extends above the adhesive and the adhesive is sandwiched between the base and the conductive layer and is non-solidified, then (6) applying heat to melt the adhesive, (7) moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer, (8) applying heat to solidify the molten adhesive, thereby mechanically attaching the post and the base to the conductive layer, then (9) providing a plated through-hole, (10) providing a conductive trace that includes a pad, a terminal, the plated through-hole and a selected portion of the conductive layer, wherein an electrically conductive path between the pad and the terminal includes the plated through-hole, then (11) mounting a semiconductor device on the post, wherein a heat spreader includes the post and the base and the semiconductor device overlaps the post, (12) electrically connecting the semiconductor device to the pad, thereby electrically connecting the semiconductor device to the terminal, and (13) thermally connecting the semiconductor device to the post, thereby thermally connecting the semiconductor device to the base.

Mounting the conductive layer can include mounting the conductive layer alone on the adhesive, or alternatively, attaching the conductive layer to a carrier, then mounting the conductive layer and the carrier on the adhesive such that the carrier overlaps the conductive layer and the conductive layer contacts the adhesive and is sandwiched between the adhesive and the carrier, and then, after solidifying the adhesive, removing the carrier and then providing the conductive trace. As another alternative, mounting the conductive layer can include mounting the conductive layer and a dielectric layer on the adhesive such that the conductive layer overlaps the dielectric layer and is spaced from the adhesive and the dielectric layer contacts and is sandwiched between the conductive layer and the adhesive.

In accordance with another aspect of the present invention, a method of making a semiconductor chip assembly includes (1) providing a post, a base, an adhesive and a substrate, wherein (a) the post is adjacent to the base, extends above the base in an upward direction, extends into an opening in the adhesive and is aligned with an aperture in the substrate, (b) the base extends below the post in a downward direction opposite the upward direction and extends laterally from the post in lateral directions orthogonal to the upward and downward directions, (c) the adhesive is mounted on and extends above the base, is sandwiched between the base and the substrate and is non-solidified, and (d) the substrate is mounted on and extends above the adhesive, wherein the substrate includes a conductive layer and a dielectric layer and the conductive layer extends above the dielectric layer, then (2) flowing the adhesive into and upward in a gap located in the aperture between the post and the substrate, (3) solidifying the adhesive, then (4) providing a plated through-hole that extends through the conductive layer, the dielectric layer, the adhesive and the base, then (5) providing a conductive trace that includes a pad, a terminal, the plated through-hole, a selected portion of the conductive layer that is adjacent to the plated through-hole and a selected portion of the base that is adjacent to the plated through-hole and spaced and separated from and no longer part of the base, wherein an electrically conductive path between the pad and the terminal includes the plated through-hole, then (6) mounting a semiconductor device on the post, wherein a heat spreader includes the post and the base and the semiconductor device overlaps the post, (7) electrically connecting the semiconductor device to the pad, thereby electrically connecting the semiconductor device to the terminal, and (8) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, and the base extends below the post in a downward direction opposite the upward direction and extends laterally from the post in lateral directions orthogonal to the upward and downward directions, (2) providing an adhesive, wherein an opening extends through the adhesive, (3) providing a substrate that includes a conductive layer and a dielectric layer, wherein an aperture extends through the substrate, (4) mounting the adhesive on the base, including inserting the post through the opening, wherein the adhesive extends above the base and the post extends through the opening, (5) mounting the substrate on the adhesive, including inserting the post into the aperture, wherein the substrate extends above the adhesive, the conductive layer extends above the dielectric layer, the post extends through the opening into the aperture and the adhesive is sandwiched between the base and the substrate and is non-solidified, then (6) applying heat to melt the adhesive, (7) moving the base and the substrate towards one another, thereby moving the post upward in the aperture and applying pressure to the molten adhesive between the base and the substrate, wherein the pressure forces the molten adhesive to flow into and upward in a gap located in the aperture between the post and the substrate, (8) applying heat to solidify the molten adhesive, thereby mechanically attaching the post and the base to the substrate, then (9) providing a plated through-hole that extends through the conductive layer, the dielectric layer, the adhesive and the base, then (10) providing a conductive trace that includes a pad, a terminal, the plated through-hole, a selected portion of the conductive layer that is adjacent to the plated through-hole and a selected portion of the base that is adjacent to the plated through-hole and spaced and separated from and no longer part of the base, wherein an electrically conductive path between the pad and the terminal includes the plated through-hole, then (11) mounting a semiconductor device on the post, wherein a heat spreader includes the post and the base and the semiconductor device overlaps the post, (12) electrically connecting the semiconductor device to the pad, thereby electrically connecting the semiconductor device to the terminal, and (13) thermally connecting the semiconductor device to the post, thereby thermally connecting the semiconductor device to the base.

Providing the post and the base can include providing a metal plate, forming an etch mask on the metal plate that selectively exposes the metal plate and defines the post, etching the metal plate in a pattern defined by the etch mask, thereby forming a recess in the metal plate that extends into but not through the metal plate, wherein the post is an unetched portion of the metal plate that protrudes above the base and is laterally surrounded by the recess and the base is an unetched portion of the metal plate below the post and the recess, and then removing the etch mask.

Providing the adhesive can include providing a prepreg with uncured epoxy, flowing the adhesive can include melting the uncured epoxy and compressing the uncured epoxy between the base and the substrate, and solidifying the adhesive can include curing the molten uncured epoxy.

Providing the heat spreader can include providing a cap on the post that extends above and is adjacent to and covers in the upward direction and extends laterally from a top of the post after solidifying the adhesive and before mounting the semiconductor device.

Providing the pad can include removing selected portions of the conductive layer after forming the plated through-hole.

Providing the pad can also include grinding the post, the adhesive and the conductive layer after solidifying the adhesive such that the post, the adhesive and the conductive layer are laterally aligned with one another at a top lateral surface that faces in the upward direction, and then removing selected portions of the conductive layer such that the pad includes a selected portion of the conductive layer. The grinding can include grinding the adhesive without grinding the post and then grinding the post, the adhesive and the conductive layer. The removing can include applying a wet chemical etch to the conductive layer using an etch mask that defines the pad.

Providing the pad can also include depositing a plated layer on the post, the adhesive and the conductive layer after the grinding and then removing selected portions of the conductive and plated layers such that the pad includes selected portions of the conductive and plated layers. Depositing the plated layer can include electrolessly plating a first plated layer on the post, the adhesive and the conductive layer and then electroplating a second plated layer on the first plated layer. The removing can include applying the wet chemical etch to the conductive and plated layers using the etch mask to define the pad.

Providing the terminal can include removing selected portions of the base after forming the plated through-hole. The removing can include applying a wet chemical etch to the base using another etch mask to define the terminal such that the terminal includes an unetched portion of the base that is spaced and separated from and no longer part of the base. Furthermore, the base can be etched before, during or after the conductive layer is etched to form the pad. Thus, the pad and the terminal can be formed simultaneously using the same wet chemical etch and different etch masks or sequentially using different etch masks.

Providing the base can include removing selected portions of the base after forming the plated through-hole. The removing can include applying a wet chemical etch to the base using an etch mask that defines a smaller portion of the base such that the base is trimmed.

Providing the pad and the plated through-hole can include drilling a hole through the conductive layer, the dielectric layer, the adhesive and the base after solidifying the adhesive, then depositing a plated layer on the post, the conductive layer, the dielectric layer, the adhesive and the base and into the hole, wherein the plated layer forms an upper plated layer that covers the post in the upward direction and the plated through-hole in the hole, then forming an etch mask on the upper plated layer that defines the pad, etching the conductive layer and the upper plated layer in a pattern defined by the etch mask, and then removing the etch mask.

Providing the terminal and the plated through-hole can include drilling a hole through the conductive layer, the dielectric layer, the adhesive and the base after solidifying the adhesive, then depositing a plated layer on the conductive layer, the dielectric layer, the adhesive and the base and into the hole, wherein the plated layer forms a lower plated layer that covers the post in the downward direction and the plated through-hole in the hole, then forming an etch mask on the lower plated layer that defines the terminal, etching the base and the lower plated layer in a pattern defined by the etch mask, wherein the terminal includes an unetched portion of the base that is adjacent to the plated through-hole and spaced and separated from and no longer part of the base, and then removing the etch mask.

Providing the pad, the terminal and the plated through-hole can include drilling a hole through the conductive layer, the dielectric layer, the adhesive and the base after solidifying the adhesive, then depositing a plated layer on the post, the conductive layer, the dielectric layer, the adhesive and the base, wherein the plated layer forms an upper plated layer that covers the post in the upward direction, a lower plated layer that covers the post in the downward direction and the plated through-hole in the hole, then forming a first etch mask on the upper plated layer that defines the pad, etching the conductive layer and the upper plated layer in a pattern defined by the first etch mask, forming a second etch mask on the lower plated layer that defines the terminal, etching the base and the lower plated layer in a pattern defined by the second etch mask, and removing the etch masks.

Furthermore, etching the conductive layer and the upper plated layer can include exposing the dielectric layer in the upward direction without exposing the adhesive in the upward direction, and etching the base and the lower plated layer can include exposing the adhesive in the downward direction without exposing the dielectric layer in the downward direction.

Providing the cap can include removing selected portions of the upper plated layer. Providing the cap can also include the grinding and then removing selected portions of the upper plated layer using the etch mask to define the pad and the cap such that the cap includes a selected portion of the upper plated layer. The cap can also include a selected portion of the conductive layer. Thus, the pad and the cap can be formed simultaneously using the same grinding, wet chemical etch and etch mask.

Flowing the adhesive can include filling the gap with the adhesive. Flowing the adhesive can also include squeezing the adhesive through the gap, above the post and the substrate and on top surface portions of the post and the substrate adjacent to the gap.

Solidifying the adhesive can include mechanically bonding the post and the base to the substrate.

Mounting the semiconductor device on the post can include mounting the semiconductor device on the cap and thus the post. Mounting the semiconductor device can also include positioning the semiconductor device above and overlapping the post, the cap, the opening and the aperture without overlapping the adhesive, the dielectric layer and the plated through-hole.

Mounting the semiconductor device can include providing a first solder joint between an LED package that includes an LED chip and the pad and a second solder joint between the LED package and the post, electrically connecting the semiconductor device can include providing the first solder joint between the LED package and the pad, and thermally connecting the semiconductor device can include providing the second solder joint between the LED package and the post.

Mounting the semiconductor device can include providing a die attach between a semiconductor chip such as an LED chip and the post, electrically connecting the semiconductor device can include providing a wire bond between the chip and the pad, and thermally connecting the semiconductor device can include providing the die attach between the chip and the post.

The adhesive can contact the post, the base, the cap, the terminal, the plated through-hole and the dielectric layer, cover the substrate in the downward direction, cover and surround the post in the lateral directions and extend to peripheral edges of the assembly after the assembly is manufactured and detached from other assemblies in a batch.

The base can cover the semiconductor device and the post and the cap but not the adhesive, the dielectric layer and the plated through-hole in the downward direction, support the substrate and the adhesive and be spaced from peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The post and the base can be integral with one another, thereby enhancing reliability. The post can provide thermal expansion matching with a semiconductor device mounted thereon, thereby increasing reliability. The cap can be customized for the semiconductor device, thereby enhancing the thermal connection. The adhesive can be sandwiched between the post and the substrate and between the base and the substrate, thereby providing a robust mechanical bond between the heat spreader and the substrate. The conductive trace can provide signal routing with simple circuitry patterns or flexible multi-layer signal routing with complex circuitry patterns. The conductive trace can also provide vertical signal routing between the pad above the adhesive and the dielectric layer and the terminal below the adhesive and the dielectric layer. The plated through-hole can be formed after the adhesive is solidified and remain a hollow tube or be split at a peripheral edge of the assembly. As a result, a solder joint subsequently reflowed on the terminal can wet and flow into the plated through-hole without creating a buried void in the solder joint beneath the plated through-hole that might otherwise occur if the plated through-hole is filled with the adhesive or another non-wettable insulator, thereby increasing reliability. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
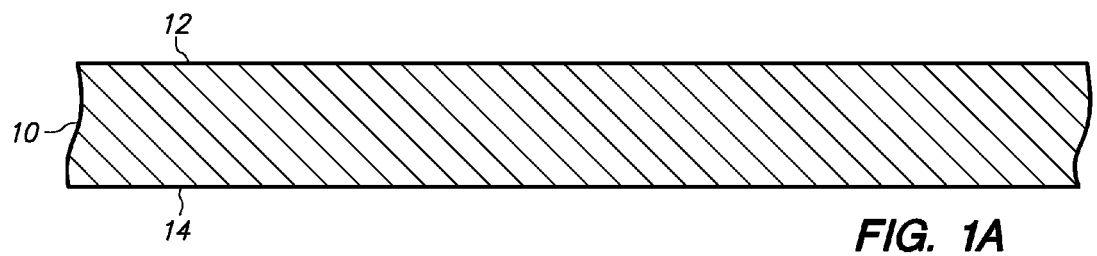
FIGS. 1A-1D are cross-sectional views showing a method of making a post and a base in accordance with an embodiment of the present invention.
Figure 1B:
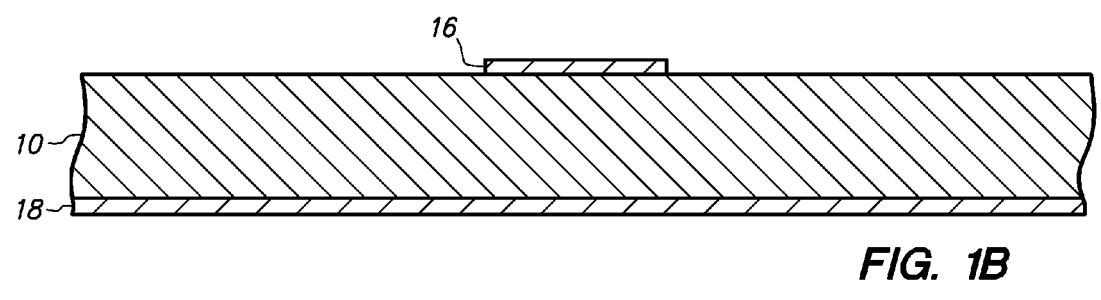
Figure 1C:
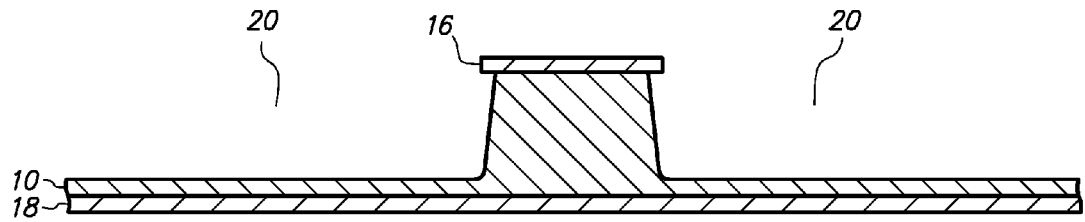
Figure 1D:
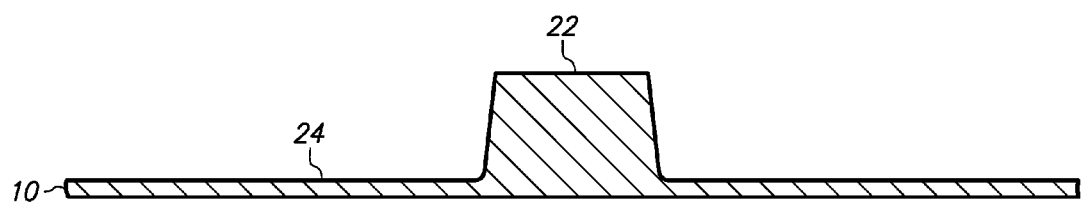
Figure 1E:
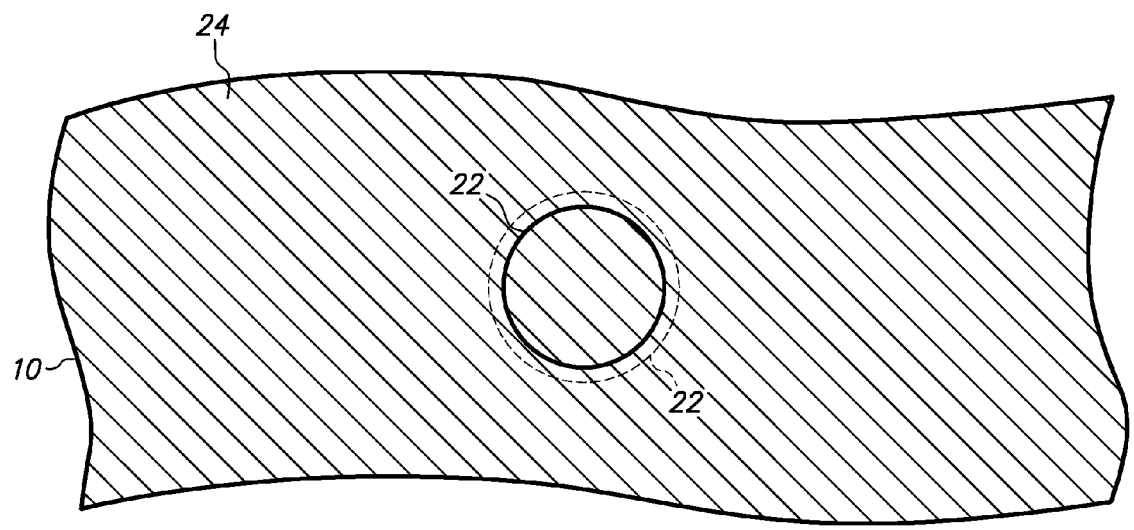
FIGS. 1E and 1F are top and bottom views, respectively, corresponding to FIG. 1D.
Figure 1F:
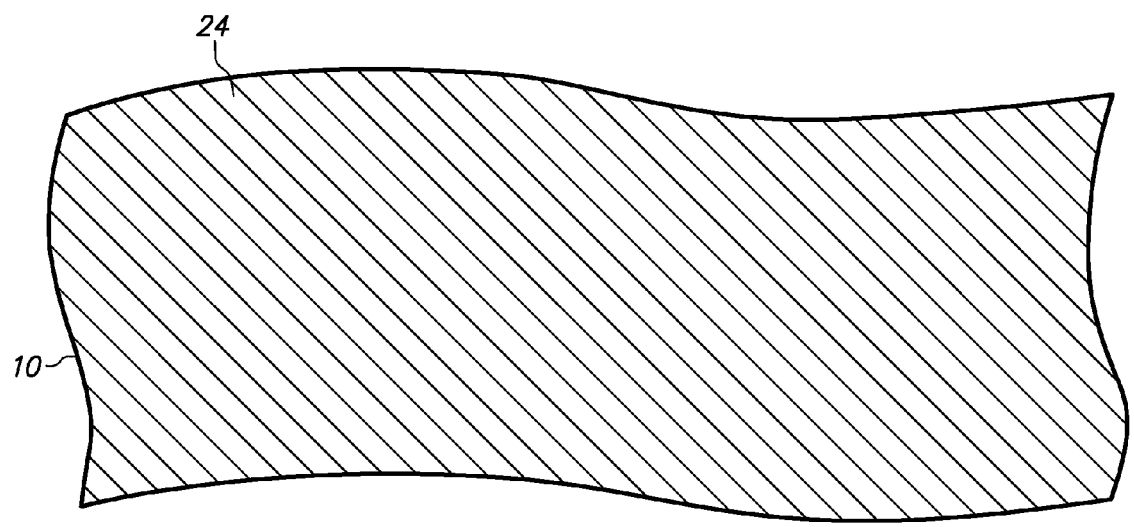

FIGS. 1A-1D are cross-sectional views showing a method of making a post and a base in accordance with an embodiment of the present invention, and FIGS. 1E and 1F are top and bottom views, respectively, corresponding to FIG. 1D.

FIG. 1A. is a cross-sectional view of metal plate 10 which includes opposing major surfaces 12 and 14. Metal plate 10 is illustrated as a copper plate with a thickness of 300 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch mask 16 and cover mask 18 formed on metal plate 10. Etch mask 16 and cover mask 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through metal plate 10 by etching metal plate 10 in the pattern defined by etch mask 16. The etching is illustrated as a frontside wet chemical etch. For instance, the structure can be inverted so that etch mask 16 faces downward and cover mask 18 faces upward as a bottom spray nozzle (not shown) that faces etch mask 16 upwardly sprays the wet chemical etch on metal plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides backside protection. The wet chemical etch is highly selective of copper and etches 270 microns into metal plate 10. As a result, recess 20 extends from surface 12 into but not through metal plate 10, is spaced from surface 14 by 30 microns and has a depth of 270 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIGS. 1D, 1E and 1F are cross-sectional, top and bottom views, respectively, of metal plate 10 after etch mask 16 and cover mask 18 are removed. The photoresist layers are stripped using a solvent, such as a strong alkaline solution containing potassium hydroxide with a pH of 14, that is highly selective of photoresist with respect to copper.

Metal plate 10 as etched includes post 22 and base 24.

Post 22 is an unetched portion of metal plate 10 defined by etch mask 16. Post 22 is adjacent to and integral with and protrudes above base 24 and is laterally surrounded by recess 20. Post 22 has a height of 270 microns (recess 20 depth), a diameter at its top surface (circular portion of surface 12) of 1000 microns and a diameter at its bottom (circular portion adjacent to base 24) of 1200 microns. Thus, post 22 has a cut-off conical shape (resembling a frustum) with tapered sidewalls in which its diameter decreases as it extends upwardly from base 24 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 24 is an unetched portion of metal plate 10 that is below post 22, covers post 22 in the downward direction, extends laterally from post 22 in a lateral plane (with lateral directions such as left and right) and has a thickness of 30 microns (300-270).

Post 22 and base 24 can be treated to improve bondability to epoxy and solder. For instance, post 22 and base 24 can be chemically oxidized or microetched to provide rougher surfaces.

Post 22 and base 24 are illustrated as a subtractively formed single-piece metal (copper). Post 22 and base 24 can also be a stamped single-piece metal formed by stamping metal plate 10 with a contact piece with a recess or hole that defines post 22. Post 22 can also be formed additively by depositing post 22 on base 24 using electroplating, chemical vapor deposition (CVD), physical vapor deposition (PVD) and so on, for instance by electroplating a solder post 22 on a copper base 24, in which case post 22 and base 24 have a metallurgical interface and are adjacent to but not integral with one another. Post 22 can also be formed semi-additively, for instance by depositing upper portions of post 22 on etch-defined lower portions of post 22. Post 22 can also be formed semi-additively by depositing conformal upper portions of post 22 on etch-defined lower portions of post 22. Post 22 can also be sintered to base 24.

Figure 2A:
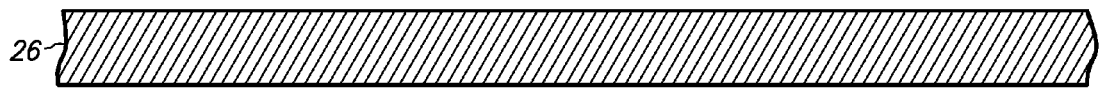
FIGS. 2A and 2B are cross-sectional views showing a method of making an adhesive in accordance with an embodiment of the present invention.
Figure 2B:
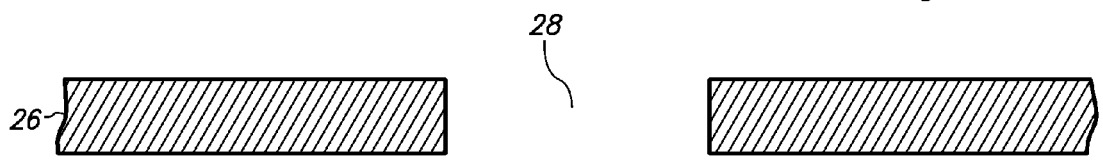
Figure 2C:
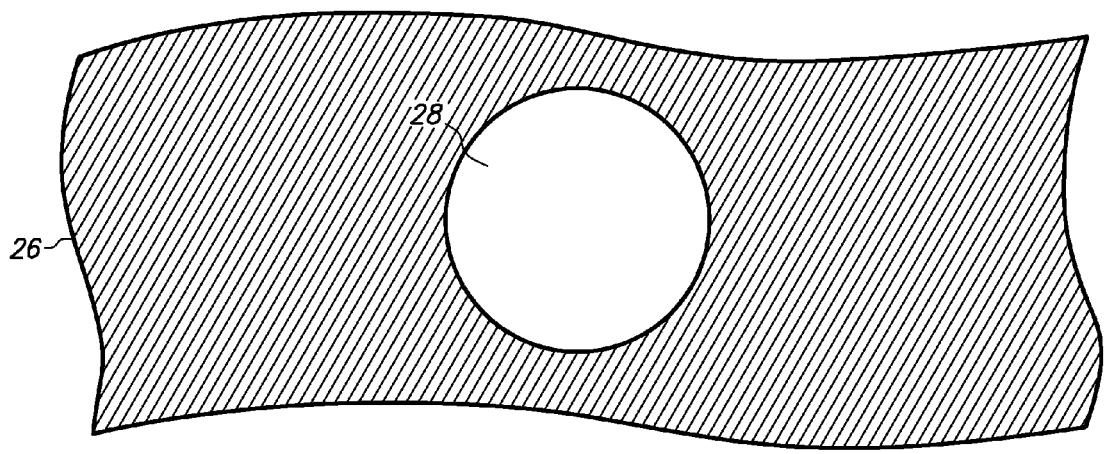
FIGS. 2C and 2D are top and bottom views, respectively, corresponding to FIG. 2B.
Figure 2D:
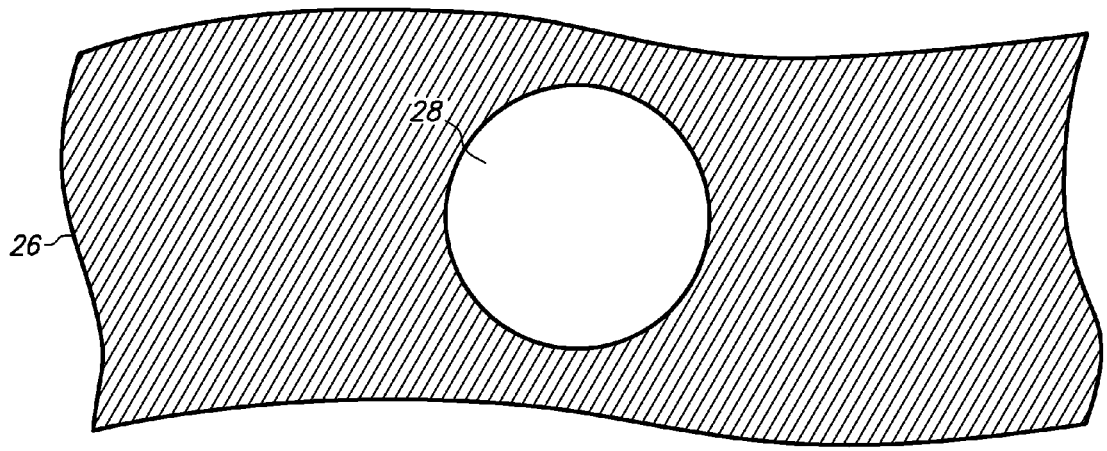

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 26. Adhesive 26 is illustrated as a prepreg with B-stage uncured epoxy provided as a non-solidified unpatterned sheet with a thickness of 150 microns.

Adhesive 26 can be various dielectric films or prepregs formed from numerous organic or inorganic electrical insulators. For instance, adhesive 26 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 26 with opening 28. Opening 28 is a window that extends through adhesive 26 and has a diameter of 1250 microns. Opening 28 is formed by mechanical drilling through the prepreg and can be formed by other techniques such as punching and stamping.

Figure 3A:
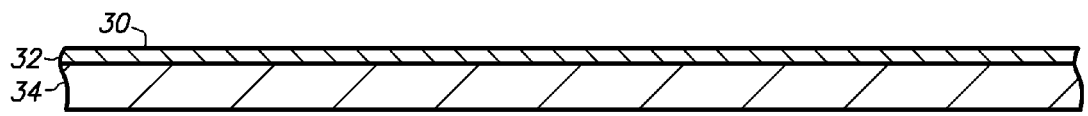
FIGS. 3A and 3B are cross-sectional views showing a method of making a substrate in accordance with an embodiment of the present invention.
Figure 3B:
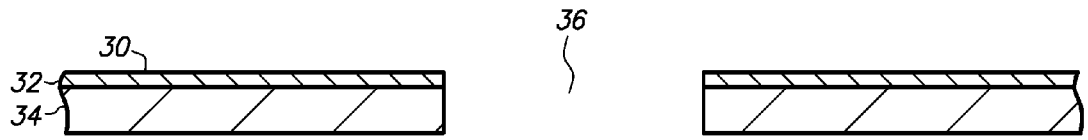
Figure 3C:
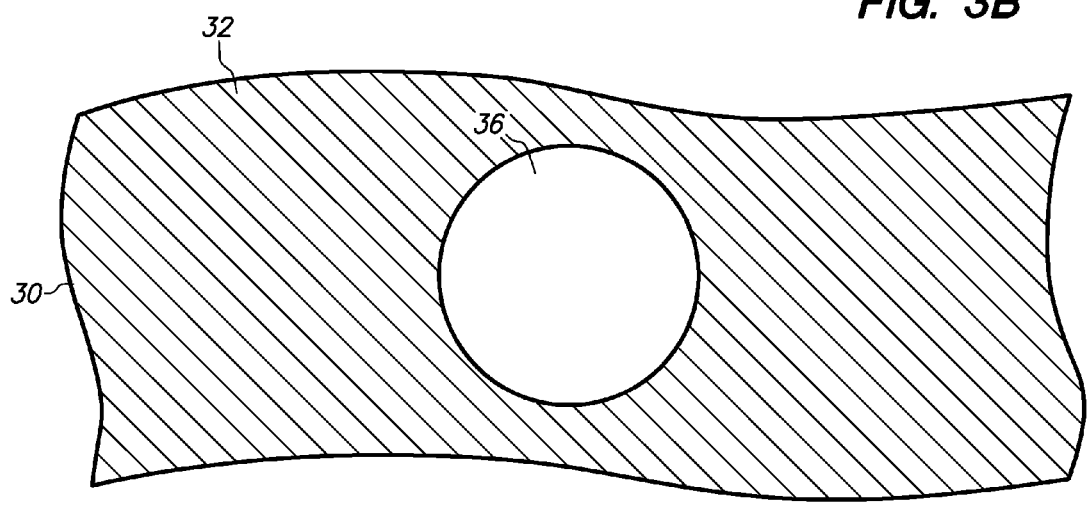
FIGS. 3C and 3D are top and bottom views, respectively, corresponding to FIG. 3B.
Figure 3D:
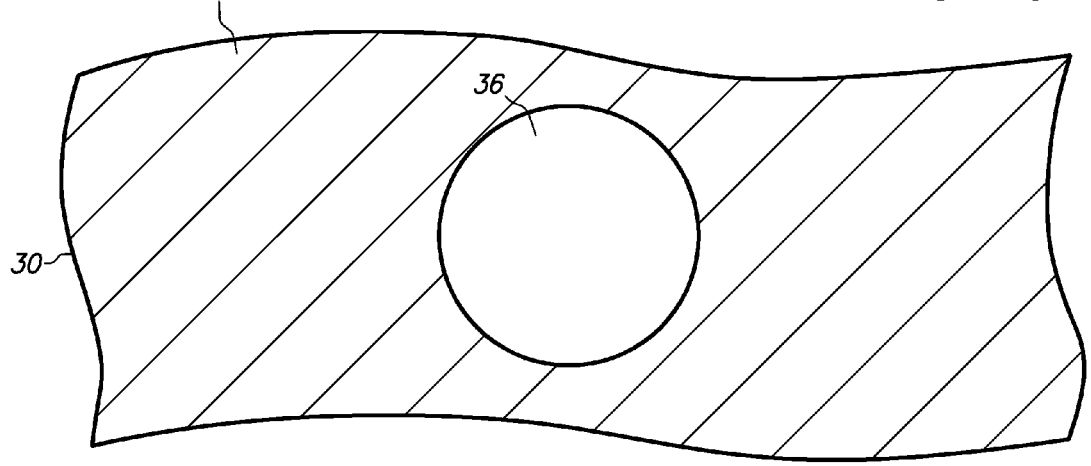

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 30 that includes conductive layer 32 and dielectric layer 34. Conductive layer 32 is an electrical conductor that contacts and extends above dielectric layer 34, and dielectric layer 34 is an electrical insulator. For instance, conductive layer 32 is an unpatterned copper sheet with a thickness of 30 microns, and dielectric layer 34 is epoxy with a thickness of 150 microns.

FIGS. 3B, 3C and 3D are cross-sectional, top and bottom views, respectively, of substrate 30 with aperture 36. Aperture 36 is a window that extends through substrate 30 and has a diameter of 1250 microns. Aperture 36 is formed by mechanical drilling through conductive layer 32 and dielectric layer 34 and can be formed with other techniques such as punching and stamping. Preferably, opening 28 and aperture 36 have the same diameter and are formed in the same manner with the same drill bit at the same drilling station.

Substrate 30 is illustrated as a laminated structure. Substrate 30 can be other electrical interconnects such as a ceramic board or a printed circuit board. Likewise, substrate 30 can include additional layers of embedded circuitry.

Figure 4A:
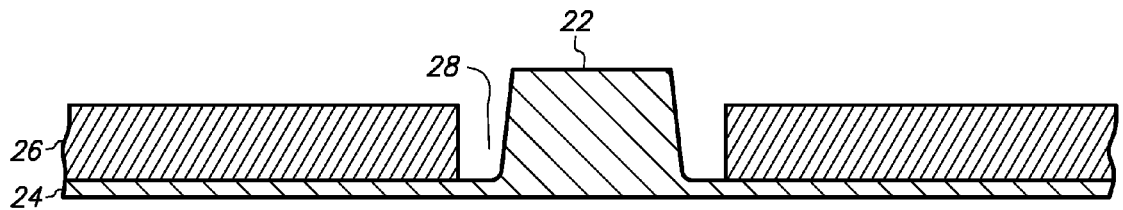
FIGS. 4A-4L are cross-sectional views showing a method of making a thermal board with a plated through-hole in accordance with an embodiment of the present invention.
Figure 4B:
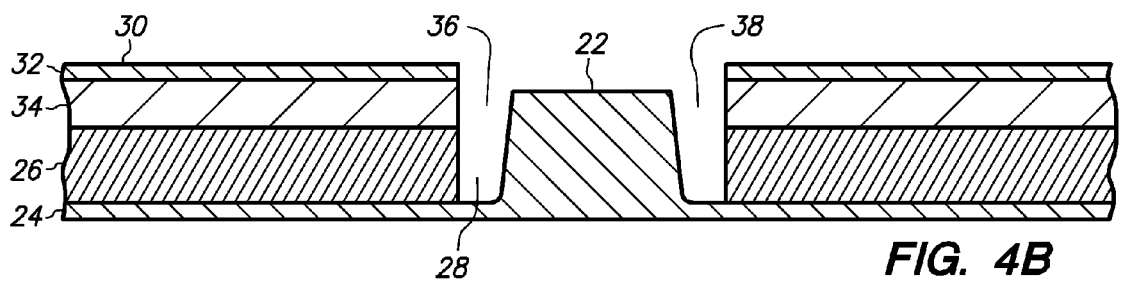
Figure 4C:
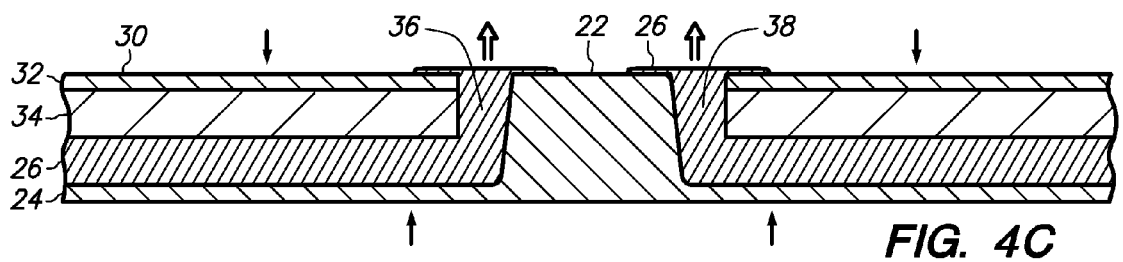
Figure 4D:
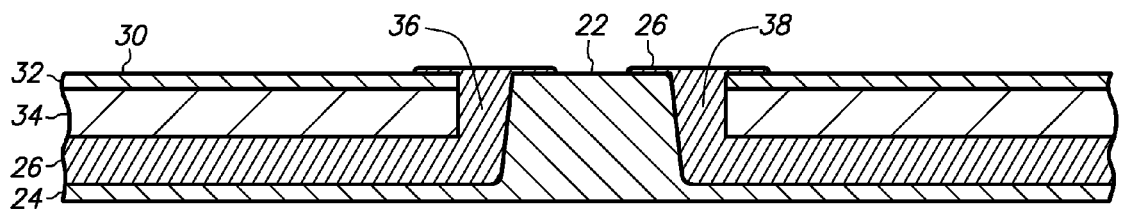
Figure 4E:
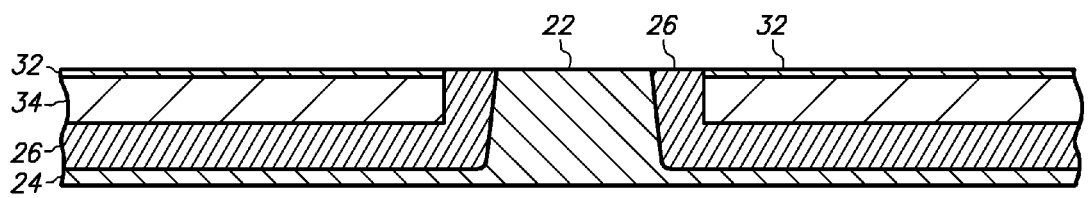
Figure 4F:
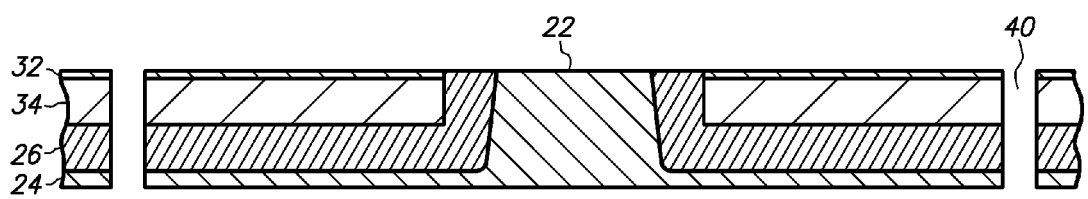
Figure 4G:
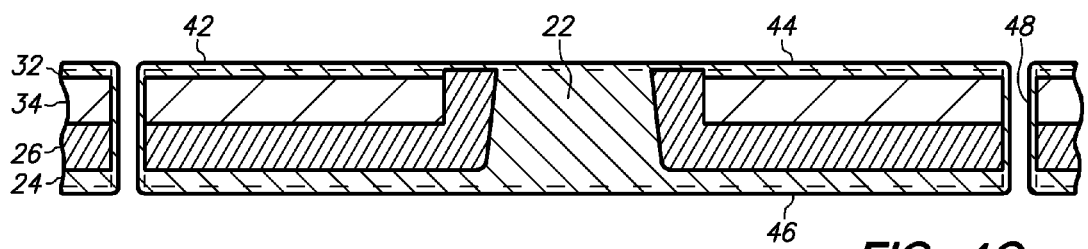
Figure 4H:
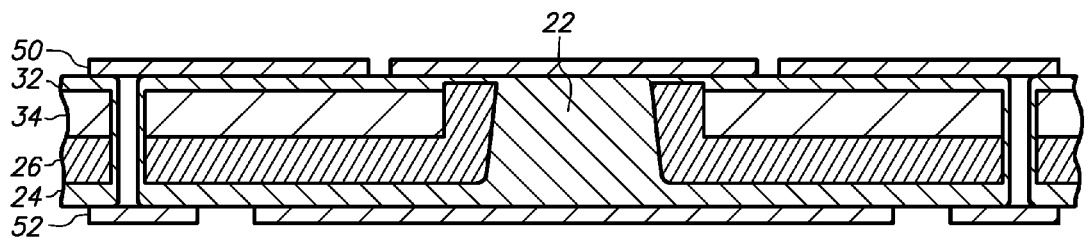
Figure 4I:
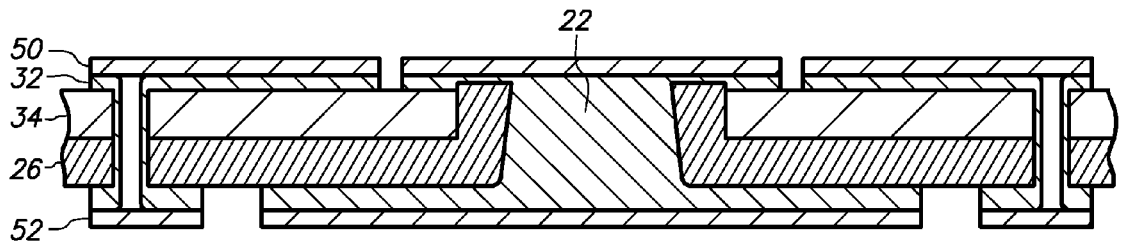
Figure 4J:
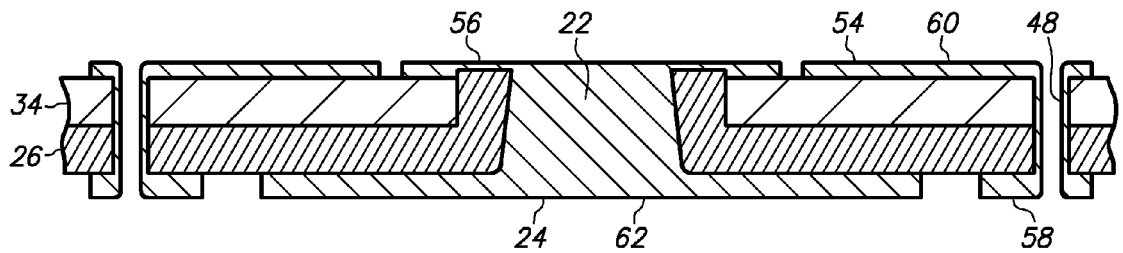
Figure 4K:
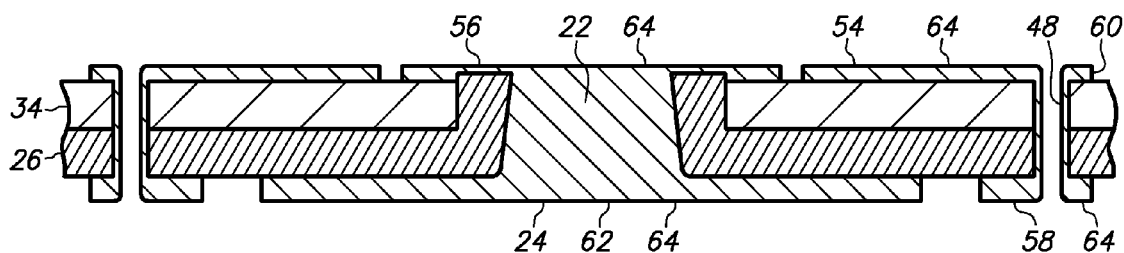
Figure 4L:
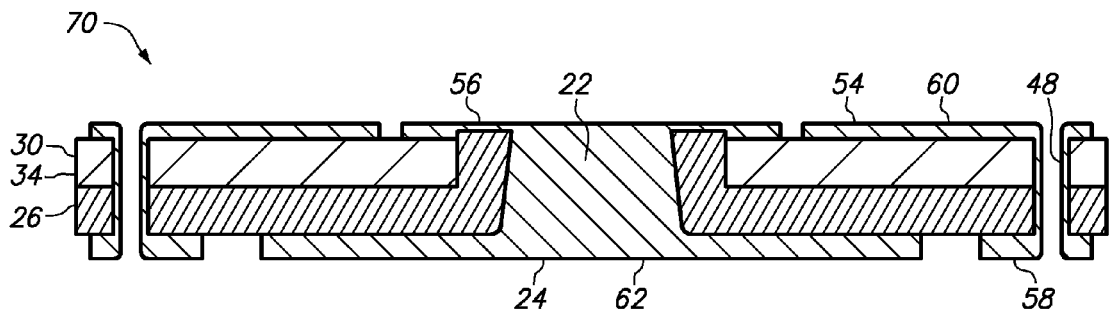
Figure 4M:
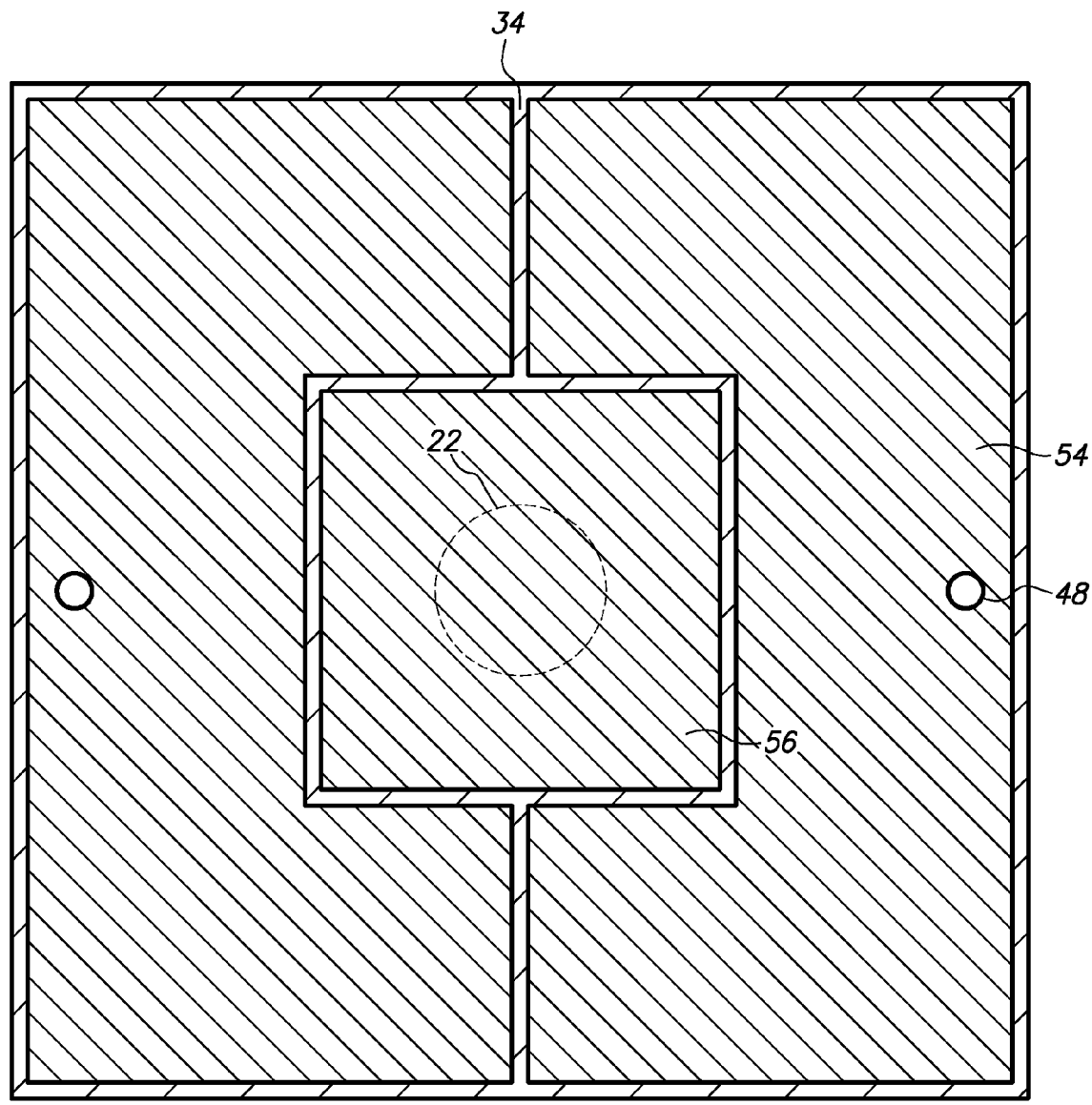
FIGS. 4M and 4N are top and bottom views, respectively, corresponding to FIG. 4L.
Figure 4N:
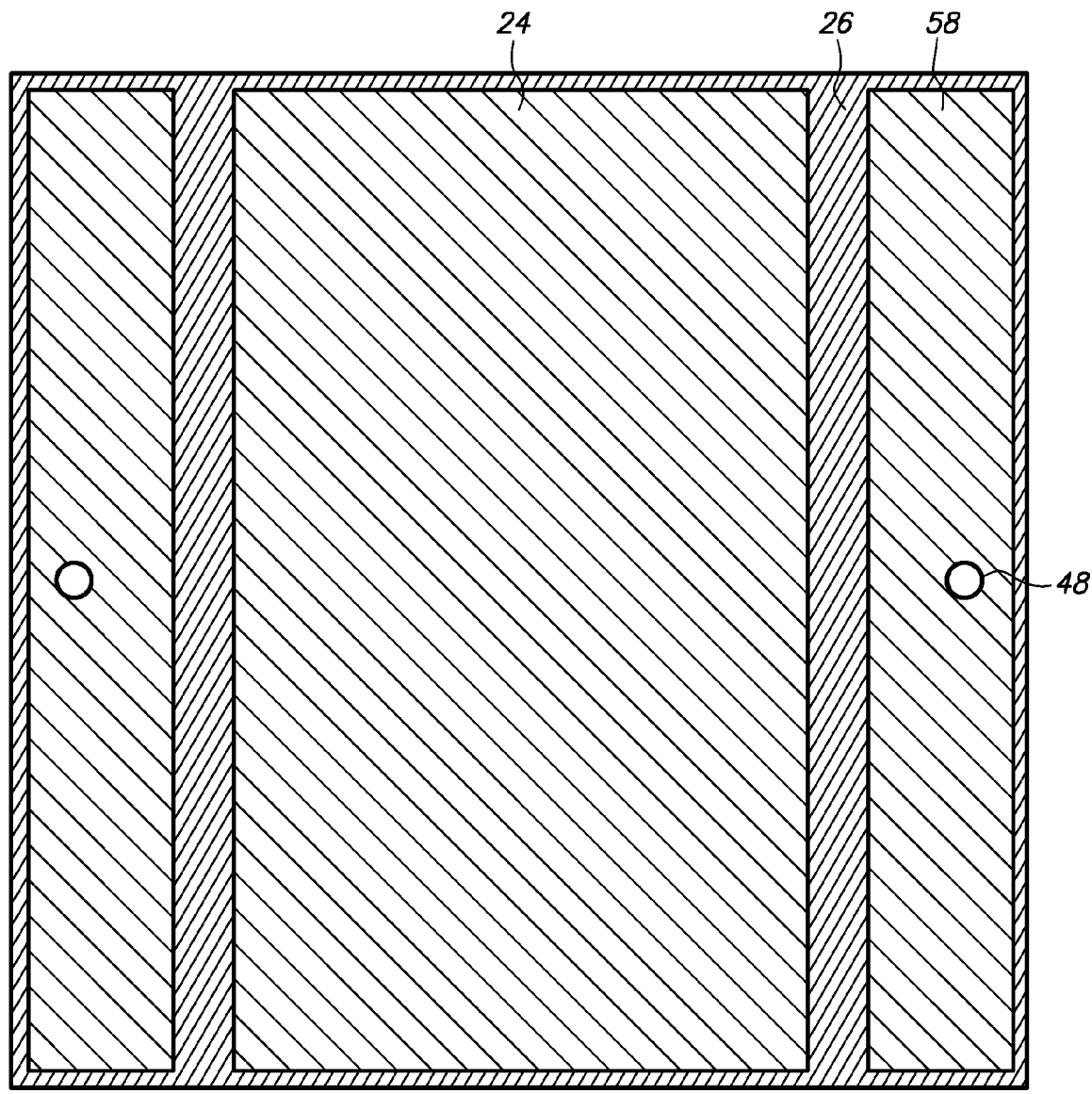

FIGS. 4A-4L are cross-sectional views showing a method of making a thermal board that includes post 22, base 24, adhesive 26, substrate 30 and a plated through-hole in accordance with an embodiment of the present invention, and FIGS. 4M and 4N are top and bottom views, respectively, corresponding to FIG. 4L.

FIG. 4A is a cross-sectional view of the structure with adhesive 26 mounted on base 24. Adhesive 26 is mounted by lowering it onto base 24 as post 22 is inserted into and through and upwards in opening 28. Adhesive 26 eventually contacts and rests on base 24. Preferably, post 22 is inserted into and extends through opening 28 without contacting adhesive 26 and is aligned with and centrally located within opening 28.

FIG. 4B is a cross-sectional view of the structure with substrate 30 mounted on adhesive 26. Substrate 30 is mounted by lowering it onto adhesive 26 as post 22 is inserted into and upwards in aperture 36. Substrate 30 eventually contacts and rests on adhesive 26.

Post 22 is inserted into but not through aperture 36 without contacting substrate 30 and is aligned with and centrally located within aperture 36. As a result, gap 38 is located in aperture 36 between post 22 and substrate 30. Gap 38 laterally surrounds post 22 and is laterally surrounded by substrate 30. In addition, opening 28 and aperture 36 are precisely aligned with one another and have the same diameter.

At this stage, substrate 30 is mounted on and contacts and extends above adhesive 26. Post 22 extends through opening 28 into aperture 36 to dielectric layer 34, is 60 microns below the top surface of conductive layer 32 and is exposed through aperture 36 in the upward direction. Adhesive 26 contacts and is sandwiched between base 24 and substrate 30, contacts dielectric layer 34 but is spaced from conductive layer 32 and remains a non-solidified prepreg with B-stage uncured epoxy, and gap 38 is filled with air.

FIG. 4C is a cross-sectional view of the structure with adhesive 26 in gap 38. Adhesive 26 is flowed into gap 38 by applying heat and pressure. In this illustration, adhesive 26 is forced into gap 38 by applying downward pressure to conductive layer 32 and/or upward pressure to base 24, thereby moving base 24 and substrate 30 towards one another and applying pressure to adhesive 26 while simultaneously applying heat to adhesive 26. Adhesive 26 becomes compliant enough under the heat and pressure to conform to virtually any shape. As a result, adhesive 26 sandwiched between base 24 and substrate 30 is compressed, forced out of its original shape and flows into and upward in gap 38. Base 24 and substrate 30 continue to move towards one another and adhesive 26 eventually fills gap 38. Moreover, adhesive 26 remains sandwiched between and continues to fill the reduced space between base 24 and substrate 30.

For instance, base 24 and conductive layer 32 can be disposed between top and bottom platens (not shown) of a press. In addition, a top cull plate and top buffer paper (not shown) can be sandwiched between conductive layer 32 and the top platen, and a bottom cull plate and bottom buffer paper (not shown) can be sandwiched between base 24 and the bottom platen. The stack includes the top platen, top cull plate, top buffer paper, substrate 30, adhesive 26, base 24, bottom buffer paper, bottom cull plate and bottom platen in descending order. Furthermore, the stack may be positioned on the bottom platen by tooling pins (not shown) that extend upward from the bottom platen through registration holes (not shown) in metal plate 10.

The platens are heated and move towards one another, thereby applying heat and pressure to adhesive 26. The cull plates disperse the heat from the platens so that it is more uniformly applied to base 24 and substrate 30 and thus adhesive 26, and the buffer papers disperse the pressure from the platens so that it is more uniformly applied to base 24 and substrate 30 and thus adhesive 26. Initially, dielectric layer 34 contacts and presses down on adhesive 26. As the platen motion and heat continue, adhesive 26 between base 24 and substrate 30 is compressed, melted and flows into and upward in gap 38 and across dielectric layer 34 to conductive layer 32. For instance, the uncured epoxy is melted by the heat and the molten uncured epoxy is squeezed by the pressure into gap 38, however the reinforcement and the filler remain between base 24 and substrate 30. Adhesive 26 elevates more rapidly than post 22 in aperture 36 and fills gap 38. Adhesive 26 also rises slightly above gap 38 and overflows onto the top surfaces of post 22 and conductive layer 32 adjacent to gap 38 before the platen motion stops. This may occur due to the prepreg being slightly thicker than necessary. As a result, adhesive 26 creates a thin coating on the top surfaces of post 22 and conductive layer 32. The platen motion is eventually blocked by post 22 and the platens become stationary but continue to apply heat to adhesive 26.

The upward flow of adhesive 26 in gap 38 is shown by the thick upward arrows, the upward motion of post 22 and base 24 relative to substrate 30 is shown by the thin upward arrows, and the downward motion of substrate 30 relative to post 22 and base 24 is shown by the thin downward arrows.

FIG. 4D is a cross-sectional view of the structure with adhesive 26 solidified.

For instance, the platens continue to clamp post 22 and base 24 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 26 as solidified provides a secure robust mechanical bond between post 22 and substrate 30 and between base 24 and substrate 30. Adhesive 26 can withstand normal operating pressure without distortion or damage and is only temporarily distorted under unusually high pressure. Furthermore, adhesive 26 can absorb thermal expansion mismatch between post 22 and substrate 30 and between base 24 and substrate 30.

At this stage, post 22 and conductive layer 32 are essentially coplanar with one another and adhesive 26 and conductive layer 32 extend to a top surface that faces in the upward direction. For instance, adhesive 26 between base 24 and dielectric layer 34 has a thickness of 90 microns which is 60 microns less than its initial thickness of 150 microns, post 22 ascends 60 microns in aperture 36 and substrate 30 descends 60 microns relative to post 22. The 270 micron height of post 22 is essentially the same as the combined height of conductive layer 32 (30 microns), dielectric layer 34 (150 microns) and the underlying adhesive 26 (90 microns). Furthermore, post 22 continues to be centrally located in opening 28 and aperture 36 and spaced from substrate 30 and adhesive 26 fills the space between post 22 and substrate 30, fills the space between base 24 and substrate 30 and fills gap 38. For instance, gap 38 (as well as adhesive 26 between post 22 and substrate 30) has a width of 125 microns ((1250−1000)/2) at the top surface of post 22. Adhesive 26 extends across conductive layer 32 and dielectric layer 34 in gap 38. That is, adhesive 26 in gap 38 extends in the upward and downward directions across the thickness of conductive layer 32 and dielectric layer 34 at the outer sidewall of gap 38. Adhesive 26 also includes a thin top portion above gap 38 that contacts the top surfaces of post 22 and conductive layer 32 and extends above post 22 by 10 microns.

FIG. 4E is a cross-sectional view of the structure after upper portions of post 22, adhesive 26 and conductive layer 32 are removed.

Post 22, adhesive 26 and conductive layer 32 have their upper portions removed by grinding. For instance, a rotating diamond sand wheel and distilled water are applied to the top of the structure. Initially, the diamond sand wheel grinds only adhesive 26. As the grinding continues, adhesive 26 becomes thinner as its grinded surface migrates downwardly. Eventually the diamond sand wheel contacts post 22 and conductive layer 32 (not necessarily at the same time), and as a result, begins to grind post 22 and conductive layer 32 as well. As the grinding continues, post 22, adhesive 26 and conductive layer 32 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 26, a 15 micron thick upper portion of post 22 and a 15 micron thick upper portion of conductive layer 32. The decreased thickness does not appreciably affect post 22 or adhesive 26. However, it substantially reduces the thickness of conductive layer 32 from 30 microns to 15 microns.

At this stage, post 22, adhesive 26 and conductive layer 32 are coplanar with one another at a smoothed lapped lateral top surface that is above dielectric layer 34 and faces in the upward direction.

FIG. 4F is a cross-sectional view of the structure with hole 40. Hole 40 is a through-hole that extends through base 24, adhesive 26, conductive layer 32 and dielectric layer 34 and has a diameter of 300 microns. Hole 40 is formed by mechanical drilling although other techniques such as laser drilling, plasma etching and wet chemical etching can be used.

FIG. 4G is a cross-sectional view of the structure with plated layer 42 deposited on post 22, base 24, adhesive 26, conductive layer 32 and dielectric layer 34. Plated layer 42 forms upper plated layer 44, lower plated layer 46 and plated through-hole 48.

Upper plated layer 44 is deposited on and contacts post 22, adhesive 26 and conductive layer 32 at the lateral top surface and covers them in the upward direction. Upper plated layer 44 is an unpatterned copper layer with a thickness of 20 microns.

Lower plated layer 46 is deposited on and contacts base 24 at the lateral bottom surface and covers it in the downward direction. Lower plated layer 46 is an unpatterned copper layer with a thickness of 20 microns.

Plated through-hole 48 is deposited on and contacts base 24, adhesive 26, conductive layer 32 and dielectric layer 34 in hole 40 and covers the sidewalls in the lateral directions. Plated through-hole 48 is a copper tube with a thickness of 20 microns and is adjacent to and integral with and electrically connects plated layers 44 and 46.

For instance, the structure is dipped in an activator solution to render adhesive 26 and dielectric layer 34 catalytic to electroless copper, then a first copper layer is electrolessly plated on post 22, base 24, adhesive 26, conductive layer 32 and dielectric layer 34, and then a second copper layer is electroplated on the first copper layer. The first copper layer has a thickness of 2 microns, the second copper layer has a thickness of 18 microns, and plated layer 42 (and plated layers 44 and 46 and plated through-hole 48) has a thickness of 20 microns. As a result, base 24 essentially grows and has a thickness of 50 microns (30+20) and conductive layer 32 essentially grows and has a thickness of 35 microns (15+20).

Upper plated layer 44 serves as a cover layer for post 22 and a build-up layer for conductive layer 32, lower plated layer 46 serves as a build-up layer for base 24 and plated through-hole 48 serves as an electrical interconnect between base 24 and conductive layer 32.

Post 22, conductive layer 32, upper plated layer 44 and plated through-hole 48 are shown as a single layer for convenience of illustration. Likewise, base 24, lower plated layer 46 and plated through-hole 48 are shown as a single layer for convenience of illustration. The boundary (shown in phantom) between post 22 and upper plated layer 44, between conductive layer 32 and upper plated layer 44, between conductive layer 32 and plated through-hole 48, between base 24 and lower plated layer 46 and between base 24 and plated through-hole 48 may be difficult or impossible to detect since copper is plated on copper. However, the boundary between adhesive 26 and upper plated layer 44 outside hole 40, between adhesive 26 and plated through-hole 48 in hole 40 and between dielectric layer 34 and plated through-hole 48 in hole 40 is clear.

FIG. 4H is a cross-sectional view of the structure with etch masks 50 and 52 formed on plated layers 44 and 46, respectively. Etch masks 50 and 52 are illustrated as photoresist layers similar to photoresist layer 16. Photoresist layer 50 has a pattern that selectively exposes upper plated layer 44, and photoresist layer 52 has a pattern that selectively exposes lower plated layer 46.

FIG. 4I is a cross-sectional view of the structure with selected portions of conductive layer 32 and upper plated layer 44 removed by etching conductive layer 32 and upper plated layer 44 in the pattern defined by etch mask 50, and selected portions of base 24 and lower plated layer 46 removed by etching base 24 and lower plated layer 46 in the pattern defined by etch mask 52. The etching is a frontside and backside wet chemical etch similar to the etch applied to metal plate 10. For instance, a top spray nozzle (not shown) and a bottom spray nozzle (not shown) can spray the wet chemical etch on the top and bottom of the structure, or the structure can be dipped in the wet chemical etch. The wet chemical etch etches through conductive layer 32 and upper plated layer 44 to expose dielectric layer 34 in the upward direction without exposing adhesive 26 in the upward direction and converts conductive layer 32 and upper plated layer 44 from unpatterned into patterned layers. The wet chemical etch also etches through base 24 and lower plated layer 46 to expose adhesive 26 in the downward direction without exposing dielectric layer 34 in the downward direction.

FIG. 4J is a cross-sectional view of the structure after etch masks 50 and 52 are removed. Photoresist layers 50 and 52 can be stripped in the same manner as photoresist layers 16 and 18.

Conductive layer 32 and upper plated layer 44 as etched include pad 54 and cap 56. Pad 54 and cap 56 are unetched portions of conductive layer 32 and upper plated layer 44 defined by etch mask 50. Thus, conductive layer 32 and upper plated layer 44 are a patterned layer that includes pad 54 and cap 56. Pad 54 is an unetched portion of conductive layer 32 and upper plated layer 44 defined by etch mask 50 that is adjacent to and extends laterally from and is electrically connected to plated through-hole 48, and cap 56 is an unetched portion of conductive layer 32 and upper plated layer 44 defined by etch mask 50 that extends above and is adjacent to and covers in the upward direction and extends laterally from and is thermally connected to post 22. Pad 54 has a thickness of 35 microns (20+15) and cap 56 has a thickness of 20 microns where it is adjacent to post 22 and a thickness of 35 microns (15+20) where it is adjacent to dielectric layer 34. Cap 56 has a thickness of 20 microns where it is adjacent to adhesive 26 and spaced from dielectric layer 34 and a thickness of 35 microns where it is adjacent to a corner-shaped interface between a side surface of adhesive 26 and a top surface of dielectric layer 34. Thus, pad 54 and cap 56 contact and extend above dielectric layer 34, have the same thickness where they overlap dielectric layer 34 and are closest to one another, have different thickness where cap 56 is adjacent to post 22 and are spaced from and coplanar with one another.

Base 24 and lower plated layer 46 as etched include base 24, reduced to its central portion and enlarged by lower plated layer 46 in the downward direction, and terminal 58. Base 24 is an unetched portion of base 24 and lower plated layer 46 defined by etch mask 52 that is adjacent to and extends laterally beyond post 22 by 1000 microns. Terminal 58 is an unetched portion of base 24 and lower plated layer 46 defined by etch mask 52 that is adjacent to and extends laterally from and is electrically connected to plated through-hole 48. Thus, terminal 58 is spaced and separated from and no longer a part of base 24. Furthermore, base 24 and terminal 58 contact and extend below adhesive 26, have a thickness of 50 microns (30+20) and are spaced from and coplanar with one another.

Conductive trace 60 is provided by plated through-hole 48, pad 54 and terminal 58. Similarly, an electrically conductive path between pad 54 and terminal 58 is plated through-hole 48.

Heat spreader 62 is provided by post 22, base 24 and cap 56. Post 22 and base 24 are integral with one another and cap 56 extends above and is adjacent to and covers in the upward direction and extends laterally in the lateral directions from the top of post 22. Cap 56 is positioned so that post 22 is centrally located within its periphery.

Heat spreader 62 is essentially a heat slug with an I-like shape that includes a pedestal (post 22), upper wings that extend laterally from the pedestal (cap 56) and lower wings that extend laterally from the pedestal (base 24).

FIG. 4K is a cross-sectional view of the structure with plated contacts 64 formed on conductive trace 60 and heat spreader 62.

Plated contacts 64 are thin spot plated metal coatings that contact the exposed copper surfaces. Thus, plated contacts 64 contact plated through-hole 48, pad 54 and cap 56 and cover them in the upward direction and contact base 24, plated through-hole 48 and terminal 58 and cover them in the downward direction. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and plated contacts 64 have a thickness of 3.5 microns.

Base 24, pad 54, cap 56 and terminal 58 treated with plated contacts 64 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 64 also protect conductive trace 60 and heat spreader 62 from corrosion. Plated contacts 64 can include a wide variety of metals to accommodate the external connection media. For instance, a gold surface layer can be plated on a buried nickel layer or a nickel surface layer alone can be employed.

Base 24, pad 54, cap 56 and terminal 58 treated with plated contacts 64 are shown as single layers for convenience of illustration. The boundary (not shown) in base 24, pad 54, cap 56 and terminal 58 with plated contacts 64 occurs at the copper/nickel interface.

At this stage, the manufacture of thermal board 70 can be considered complete.

FIGS. 4L, 4M and 4N are cross-sectional, top and bottom views, respectively, of thermal board 70 after it is detached at peripheral edges along cut lines from a support frame and/or adjacent thermal boards in a batch.

Thermal board 70 includes adhesive 26, substrate 30, conductive trace 60 and heat spreader 62. Substrate 30 includes dielectric layer 34. Conductive trace 60 includes plated through-hole 48, pad 54 and terminal 58. Heat spreader 62 includes post 22, base 24 and cap 56.

Post 22 extends into and remains centrally located within opening 28 and aperture 36 and is coplanar at its top with an adjacent portion of adhesive 26 that contacts cap 56 and at its bottom with an adjacent portion of adhesive 26 that contacts base 24. Post 22 retains its cut-off conical shape with tapered sidewalls in which its diameter decreases as it extends upwardly from base 24 to its flat circular top adjacent to cap 56.

Base 24 covers post 22 in the downward direction and is spaced from the peripheral edges of thermal board 70.

Adhesive 26 is mounted on and extends above base 24 and terminal 58, extends across dielectric layer 34 in gap 38, contacts and is sandwiched between and fills the space between post 22 and dielectric layer 34, contacts and is sandwiched between post 22 and plated through-hole 48, contacts and is sandwiched between base 24 and dielectric layer 34, contacts and is sandwiched between base 24 and cap 56 and contacts and is sandwiched between dielectric layer 34 and terminal 58. Adhesive 26 also contacts plated through-hole 48, cap 56 and terminal 58. Adhesive 26 also extends laterally from post 22 beyond and overlaps terminal 58, covers base 24 outside the periphery of post 22 in the upward direction, covers terminal 58 outside the periphery of plated through-hole 48 in the upward direction, covers substrate 30 in the downward direction, covers and surrounds post 22 in the lateral directions, fills most of the space between substrate 30 and heat spreader 62 and is solidified.

Adhesive 26 alone can intersect an imaginary horizontal line between post 22 and dielectric layer 34, an imaginary horizontal line between post 22 and plated through-hole 48, an imaginary vertical line between base 24 and dielectric layer 34, an imaginary vertical line between base 24 and cap 56 and an imaginary vertical line between dielectric layer 34 and terminal 58. Thus, an imaginary horizontal line exists that intersects only adhesive 26 as the line extends from post 22 to dielectric layer 34, an imaginary vertical line exists that intersects only adhesive 26 as the line extends from base 24 to dielectric layer 34 and so on.

Substrate 30 is mounted on and contacts adhesive 26, extends above the underlying adhesive 26 and is located above and spaced from base 24 and terminal 58. Substrate 30 includes pad 54 but does not include terminal 58. Furthermore, dielectric layer 34 contacts and is sandwiched between adhesive 26 and pad 44 and between adhesive 26 and cap 54.

Pad 54 and cap 56 contact and extend above dielectric layer 34, and dielectric layer 34 contacts and is sandwiched between adhesive 26 and pad 54 and between adhesive 26 and cap 56.

Plated through-hole 48 contacts and extends above and below and through adhesive 26 and dielectric layer 34 in hole 40. Plated through-hole 48 also retains its tubular shape with straight vertical inner and outer sidewalls in which its diameter is constant as it extends vertically from pad 54 to terminal 58.

Post 22 is coplanar with adhesive 26 at their tops at cap 56 and at their bottoms at base 24. Pad 54 and cap 56 have the same thickness where they are closest to one another, have different thickness where cap 56 is adjacent to post 22 and are coplanar with one another above adhesive 26 and dielectric layer 34 at a top surface that faces in the upward direction. Base 24 and terminal 58 have the same thickness and are coplanar with one another below adhesive 26 and dielectric layer 34 at a bottom surface that faces in the downward direction.

Adhesive 26 and dielectric layer 34 extend to straight vertical peripheral edges of thermal board 70 after it is detached or singulated from a batch of identical simultaneously manufactured thermal boards.

Pad 54 is customized as an electrical interface for a semiconductor device such as an LED chip that is subsequently mounted on cap 56, terminal 58 is customized as an electrical interface for the next level assembly such as a solderable electrical contact from a printed circuit board, cap 56 is customized as a thermal interface for the semiconductor device, and base 24 is customized as a thermal interface for the next level assembly such as the printed circuit board or a heat sink for an electronic device.

Pad 54 and terminal 58 are horizontally and vertically offset from one another and exposed at the top and bottom surfaces, respectively, of thermal board 70, thereby providing horizontal and vertical signal routing between the semiconductor device and the next level assembly.

Conductive trace 60 provides horizontal (fan-out) routing by pad 54 to plated through-hole 48 and vertical (top to bottom) routing from pad 54 to terminal 58 by plated through-hole 48. Conductive trace 60 is not limited to this configuration. For instance, pad 54 can be electrically connected to plated through-hole 48 by a routing line above dielectric layer 34 as defined by etch mask 50, and terminal 58 can be electrically connected to plated through-hole 48 by a routing line below adhesive 26 as defined by etch mask 52. Pad 54 can be electrically connected to terminal 58 by separate plated through-holes 48 in separate electrically conductive paths. Furthermore, the electrically conductive path can include vias that extend through dielectric layer 34 and routing lines (above and/or below adhesive 26 and/or dielectric layer 34) as well as passive components such as resistors and capacitors mounted on additional pads.

Conductive trace 60 is shown in cross-section as a continuous circuit trace for convenience of illustration. However, conductive trace 60 can provide horizontal signal routing in both the X and Y directions. That is, pad 54 and terminal 58 can be laterally offset from one another in the X and Y directions. Furthermore, plated through-hole 48 can be located between base 24 and terminal 58 or between terminal 58 and a corner of thermal board 70.

Conductive trace 60 and heat spreader 62 remain spaced from one another. As a result, conductive trace 60 and heat spreader 62 are mechanically attached and electrically isolated from one another.

Heat spreader 62 provides heat spreading and heat dissipation from a semiconductor device that is subsequently mounted on cap 56 to the next level assembly that thermal board 70 is subsequently mounted on. The semiconductor device generates heat that flows into cap 56, from cap 56 into post 22 and through post 22 into base 24 where it is spread out and dissipated in the downward direction, for instance to an underlying heat sink.

Plated contacts 64 occupy 85 to 95 percent of the top surface of thermal board 70 and thus provide a highly reflective top surface which is particularly useful if an LED device is subsequently mounted on cap 56.

Post 22 is copper. Base 24, plated through-hole 48, pad 54, cap 56 and terminal 58 are copper/nickel/silver. Base 24, plated through-hole 48, pad 54, cap 56 and terminal 58 consist of a silver surface layer, a buried copper core and a buried nickel layer that contacts and is sandwiched between the silver surface layer and the buried copper core. Base 24, plated through-hole 48, pad 54, cap 56 and terminal 58 are also primarily copper at the buried copper core. Plated contacts 64 provide the silver surface layer and the buried nickel layer and various combinations of metal plate 10, conductive layer 32 and plated layer 42 provide the buried copper core.

Conductive trace 60 includes a buried copper core shared by plated through-hole 48, pad 54 and terminal 58 and heat spreader 62 includes a buried copper core shared by post 22, base 24 and cap 56. Furthermore, conductive trace 60 includes a plated contact 64 at plated through-hole 48, pad 54 and terminal 58 and heat spreader 62 includes a plated contact 64 at cap 56 and spaced from post 22 and base 24 and another plated contact 64 at base 24 and spaced from post 22 and cap 56. Moreover, conductive trace 60 and heat spreader 62 consist of copper/nickel/silver and are primarily copper at the buried copper core.

Thermal board 70 does not expose post 22 which is covered by cap 56 in the upward direction. Post 22 is shown in phantom in FIG. 4M for convenience of illustration.

Thermal board 70 can include multiple conductive traces 60 with a plated through-hole 48, pad 54 and terminal 58. A single conductive trace 60 is described and labeled for convenience of illustration. In conductive traces 60, plated through-holes 48, pads 54 and terminals 58 generally have similar shapes and sizes. For instance, some conductive traces 60 may be spaced and separated and electrically isolated from one another whereas other conductive traces 60 can intersect or route to the same pad 54 or terminal 58 and be electrically connected to one another. Likewise, some pads 54 may receive independent signals whereas other pads 54 share a common signal, power or ground.

Thermal board 70 can be adapted for an LED package with blue, green and red LED chips, with each LED chip including an anode and a cathode and each LED package including a corresponding anode terminal and cathode terminal. In this instance, thermal board 70 can include six pads 54 and four terminals 58 so that each anode is routed from a separate pad 54 to a separate terminal 58 whereas each cathode is routed from a separate pad 54 to a common ground terminal 58.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 60 after they are formed. A plating bus can be disconnected during the wet chemical etch that forms pad 54 and cap 56.

Thermal board 70 can include registration holes (not shown) that are drilled or sliced through adhesive 26 and substrate 30 so that thermal board 70 can be positioned by inserting tooling pins through the registration holes when it is subsequently mounted on an underlying carrier.

Thermal board 70 can accommodate multiple semiconductor devices rather than one with a single post 22 or multiple posts 22. Thus, multiple semiconductor devices can be mounted on a single post 22 or separate semiconductor devices can be mounted on separate posts 22.

Thermal board 70 with a single post 22 for multiple semiconductor devices can be accomplished by drilling additional holes to define additional plated through-holes 48, adjusting etch mask 50 to define additional pads 54 and adjusting etch mask 52 to define additional terminals 58. The plated through-holes 48, pads 54 and terminals 58 can be laterally repositioned to provide a 2×2 array for four semiconductor devices. In addition, the topography (lateral shape) can be adjusted for pads 54 and terminals 58.

Thermal board 70 with multiple posts 22 for multiple semiconductor devices can be accomplished by adjusting etch mask 16 to define additional posts 22, adjusting adhesive 26 to include additional openings 28, adjusting substrate 30 to include additional apertures 36, drilling additional holes to define additional plated through-holes 48, adjusting etch mask 50 to define additional pads 54 and caps 56 and adjusting etch mask 52 to define additional bases 24 and terminals 58. These elements can be laterally repositioned to provide a 2×2 array for four semiconductor devices. In addition, the topography (lateral shape) can be adjusted for posts 22, bases 24, pads 54, caps 56 and terminals 58. Furthermore, posts 22 can have separate bases 24 or share a single base 24 as defined by etch mask 52.

Figure 5A:
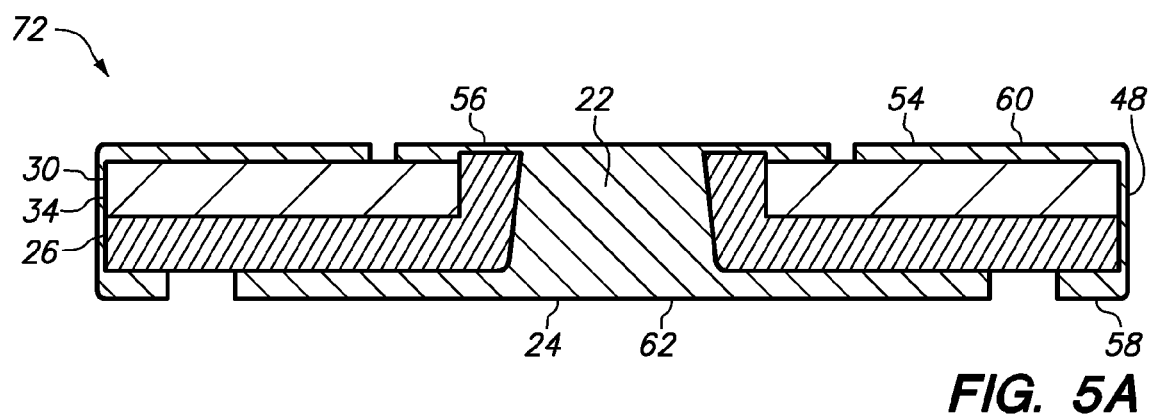
FIGS. 5A, 5B and 5C are cross-sectional, top and bottom views, respectively, of a thermal board with a plated through-hole at a peripheral edge in accordance with an embodiment of the present invention.
Figure 5B:
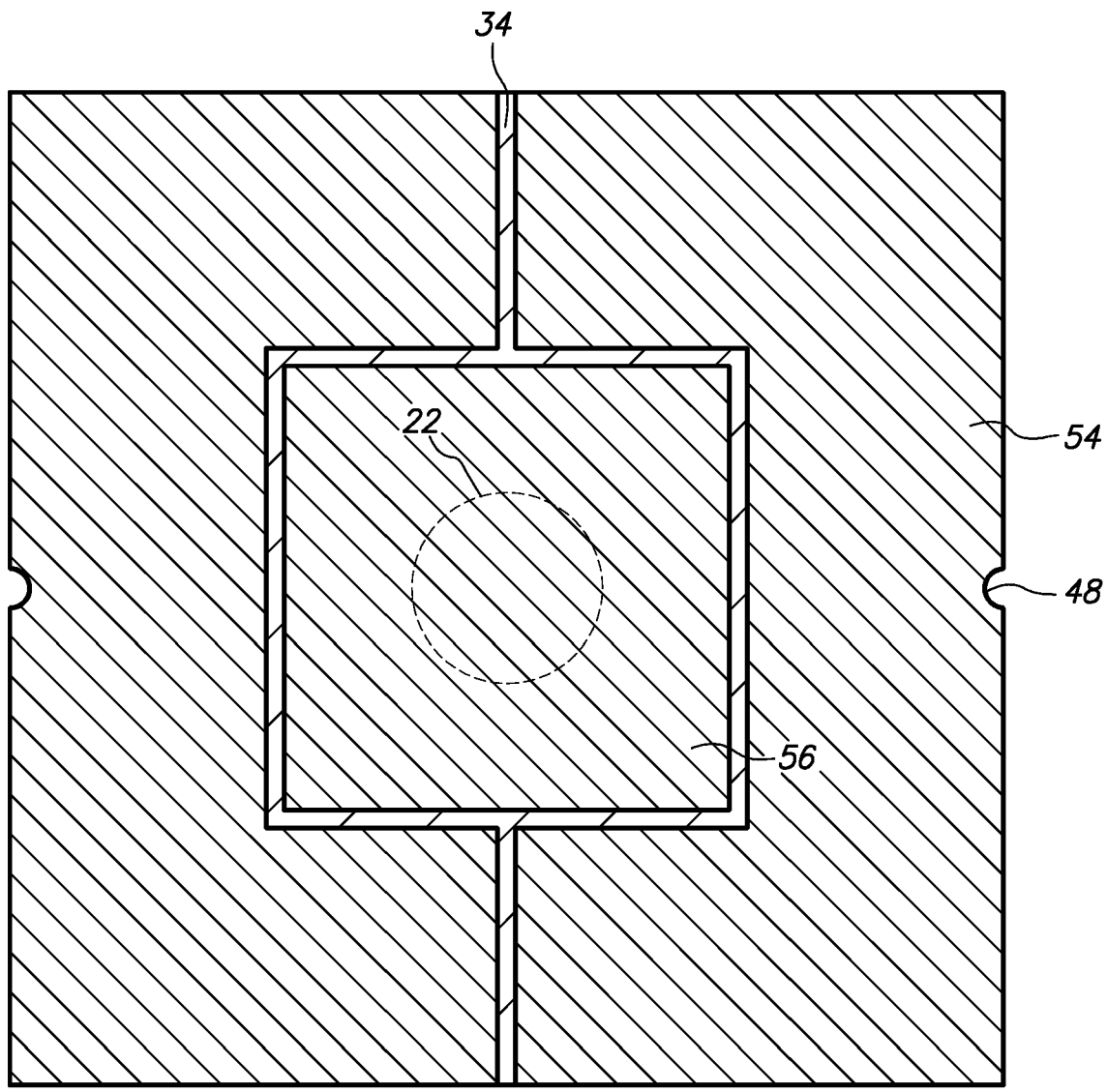
Figure 5C:
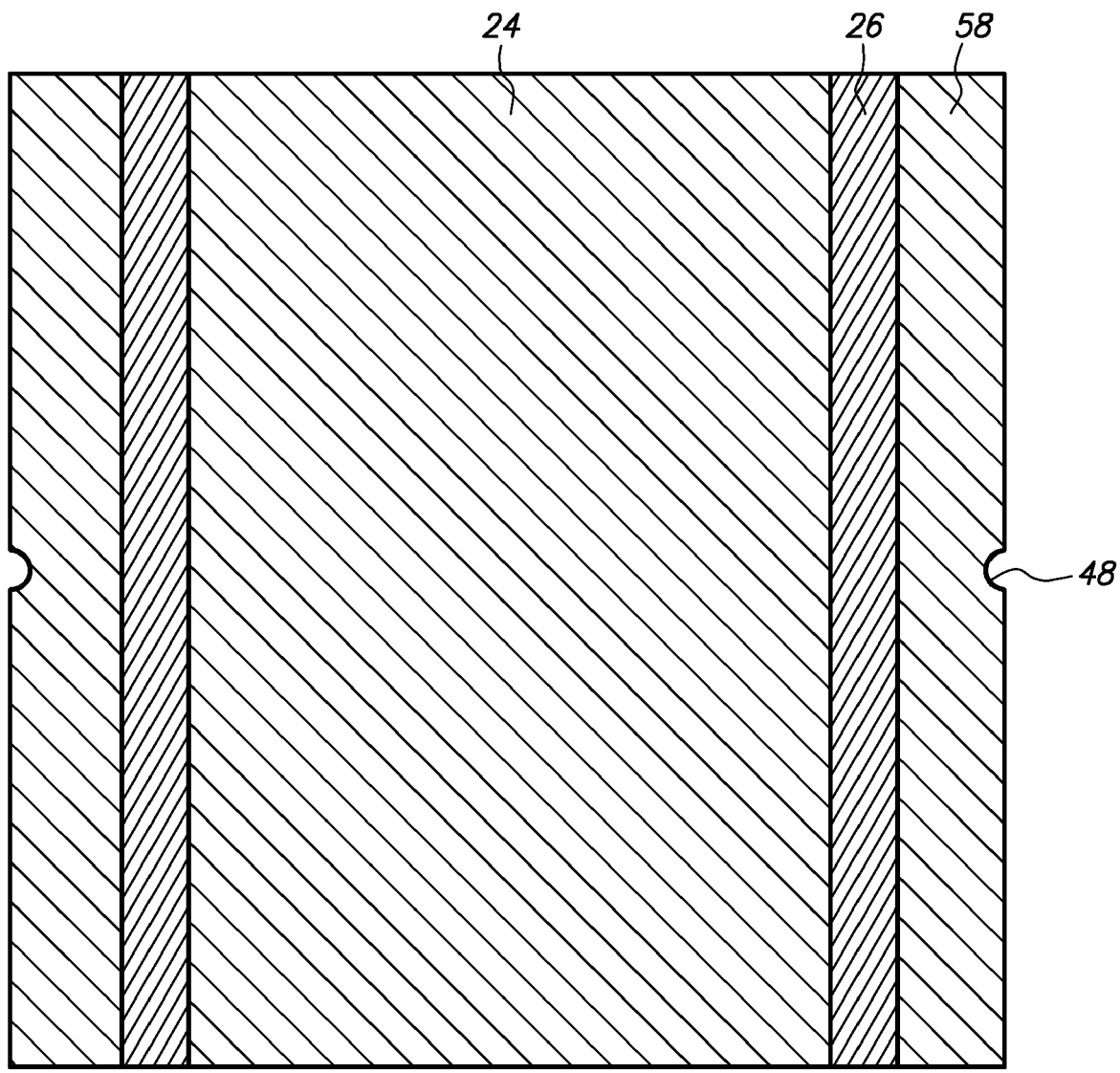

FIGS. 5A, 5B and 5C are cross-sectional, top and bottom views, respectively, of a thermal board with a plated through-hole at a peripheral edge in accordance with an embodiment of the present invention.

In this embodiment, the plated through-hole is located at a peripheral edge where the thermal board is detached. For purposes of brevity, any description of thermal board 70 is incorporated herein insofar as the same is applicable, and the same description need not be repeated. Likewise, elements of the thermal board similar to those in thermal board 70 have corresponding reference numerals.

Thermal board 72 includes adhesive 26, substrate 30, conductive trace 60 and heat spreader 62. Substrate 30 includes dielectric layer 34. Conductive trace 60 includes plated through-hole 48, pad 54 and terminal 58. Heat spreader 62 includes post 22, base 24 and cap 56.

Plated through-hole 48 is located at a peripheral edge of thermal board 72 rather than spaced from the peripheral edges of thermal board 72. As a result, thermal board 72 is more compact than thermal board 70. Furthermore, plated through-hole 48 has a semi-tubular shape with a semi-circular circumference rather than a tubular shape with a circular circumference and adhesive 26 extends laterally from post 22 to but not beyond terminal 58.

Thermal board 72 can be manufactured in a manner similar to thermal board 70 with suitable adjustments for plated through-hole 48. For instance, adhesive 26 is mounted on base 24, substrate 30 is mounted on adhesive 26, heat and pressure are applied to flow and solidify adhesive 26, grinding is applied to planarize the top surface, hole 40 is drilled through the structure and then plated layers 44 and 46 and plated through-hole 48 are deposited on the structure as previously described. Thereafter, conductive layer 32 and plated layer 44 are etched to form pad 54 and cap 56, base 24 and plated layer 46 are etched to form terminal 58 and then plated contacts 64 provide a surface finish for base 24, pad 54, cap 56 and terminal 58. Thereafter, base 24, adhesive 26, substrate 30, plated through-hole 48, pad 54 and terminal 58 are cut or cracked at the peripheral edges of thermal board 72 to detach it from the batch. As a result, a semi-tubular portion of plated through-hole 48 is detached from the peripheral edge while another semi-tubular portion of plated through-hole 48 at the peripheral edge remains intact.

Figure 6A:
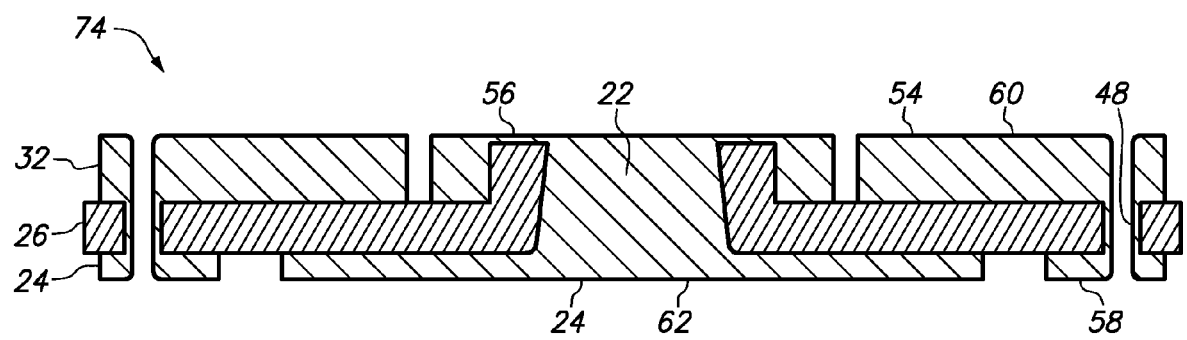
FIGS. 6A, 6B and 6C are cross-sectional, top and bottom views, respectively, of a thermal board with a conductive trace on an adhesive in accordance with an embodiment of the present invention.
Figure 6B:
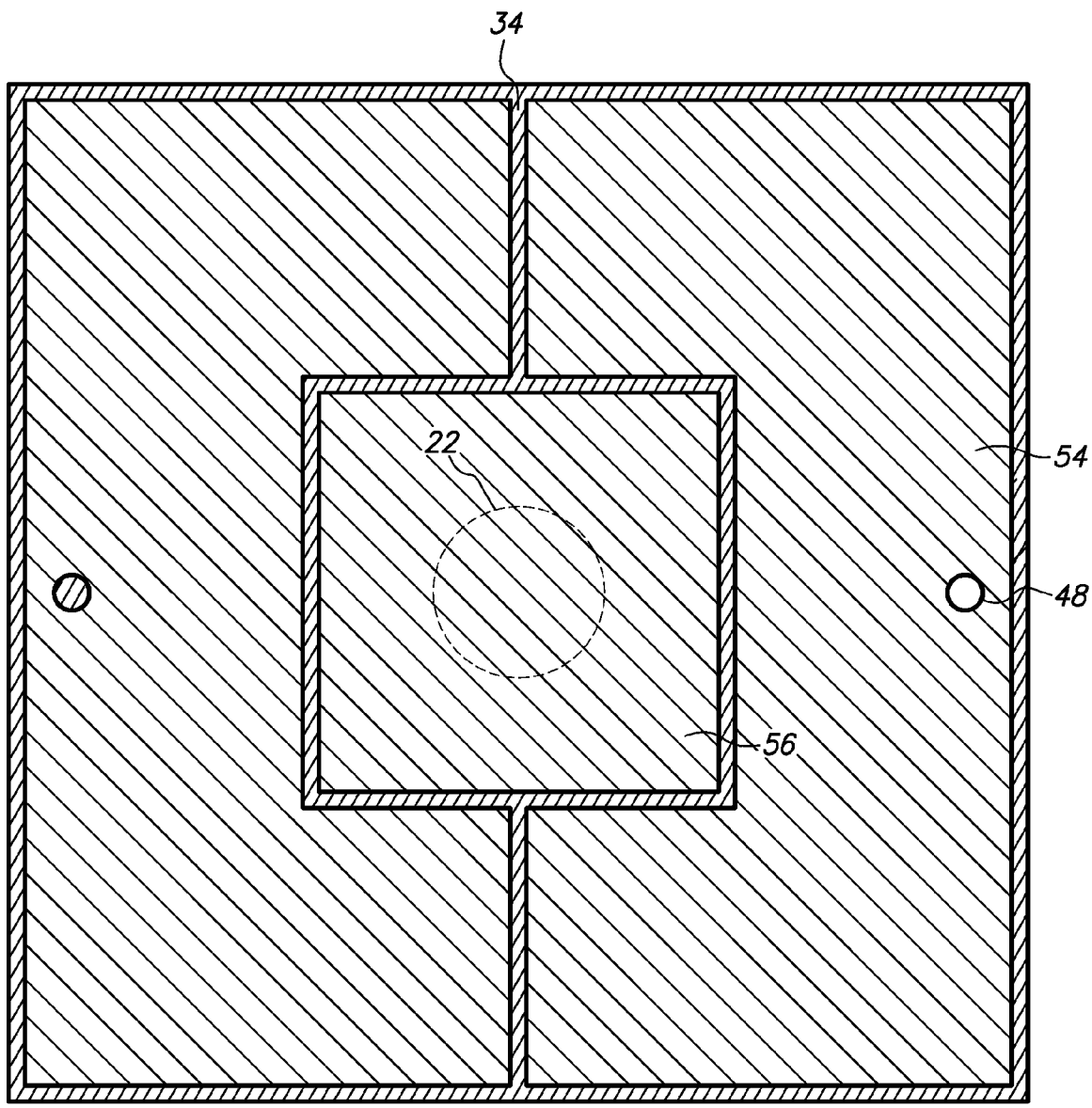
Figure 6C:
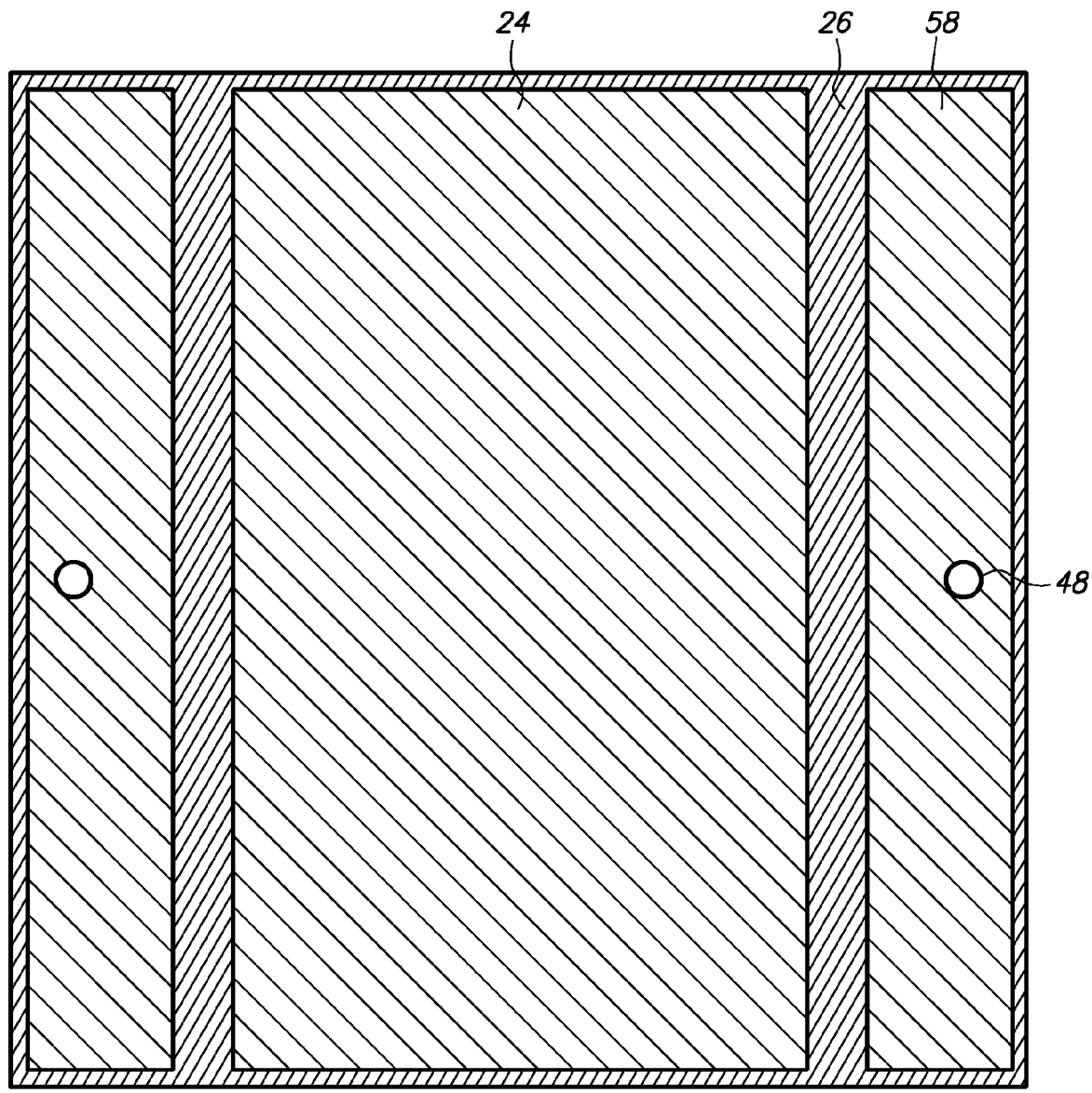

FIGS. 6A, 6B and 6C are cross-sectional, top and bottom views, respectively, of a thermal board with a conductive trace on an adhesive in accordance with an embodiment of the present invention.

In this embodiment, the conductive trace contacts the adhesive and the dielectric layer is omitted. For purposes of brevity, any description of thermal board 70 is incorporated herein insofar as the same is applicable, and the same description need not be repeated. Likewise, elements of the thermal board similar to those in thermal board 70 have corresponding reference numerals.

Thermal board 74 includes adhesive 26, conductive trace 60 and heat spreader 62. Conductive trace 60 includes plated through-hole 48, pad 54 and terminal 58. Heat spreader 62 includes post 22, base 24 and cap 56.

Conductive layer 32 is thicker in this embodiment than the previous embodiment. For instance, conductive layer 32 has a thickness of 130 microns (rather than 30 microns) so that it can be handled without warping or wobbling. Pad 54 and cap 56 are therefore thicker, and thermal board 74 is devoid of a dielectric layer corresponding to dielectric layer 34.

Thermal board 74 can be manufactured in a manner similar to thermal board 70 with suitable adjustments for conductive layer 32. For instance, adhesive 26 is mounted on base 24, conductive layer 32 alone is mounted on adhesive 26, heat and pressure are applied to flow and solidify adhesive 26, grinding is applied to planarize the top surface, hole 40 is drilled through the structure and then plated layers 44 and 46 and plated through-hole 48 are deposited on the structure as previously described. Thereafter, conductive layer 32 and plated layer 44 are etched to form pad 54 and cap 56, base 24 and plated layer 46 are etched to form terminal 58 and then plated contacts 64 provide a surface finish for base 24, pad 54, cap 56 and terminal 58. Thereafter, adhesive 26 is cut or cracked at the peripheral edges of thermal board 74 to detach it from the batch.

Figure 7A:
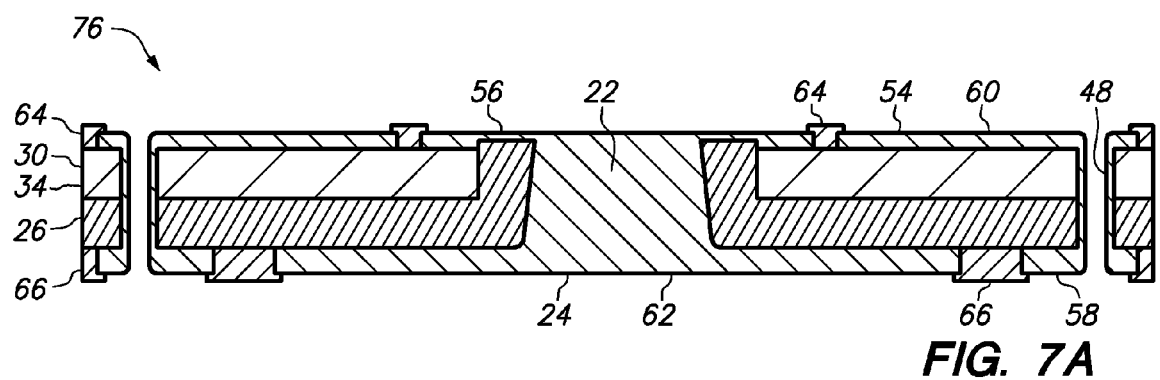
FIGS. 7A, 7B and 7C are cross-sectional, top and bottom views, respectively, of a thermal board with solder masks in accordance with an embodiment of the present invention.
Figure 7B:
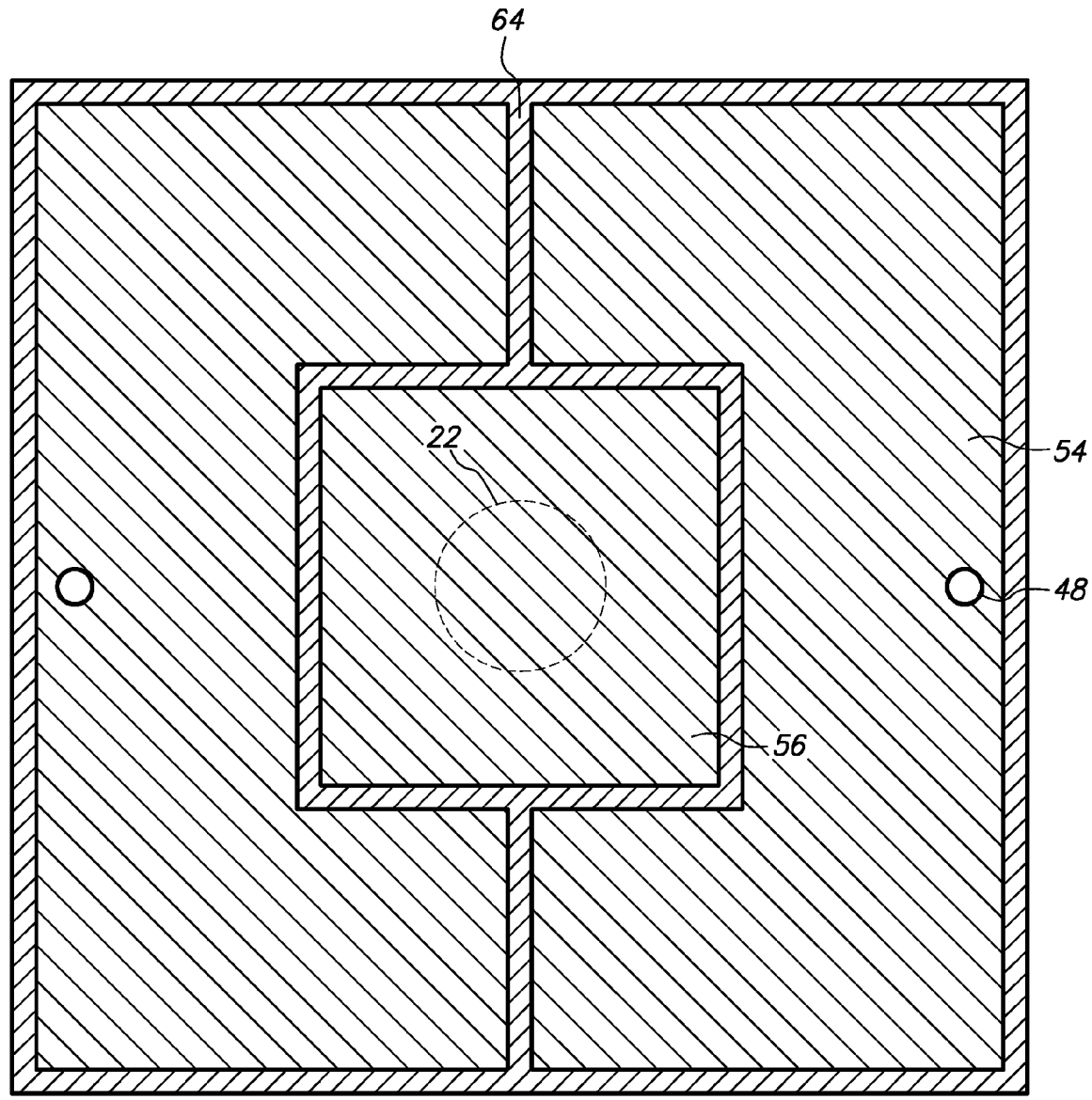
Figure 7C:
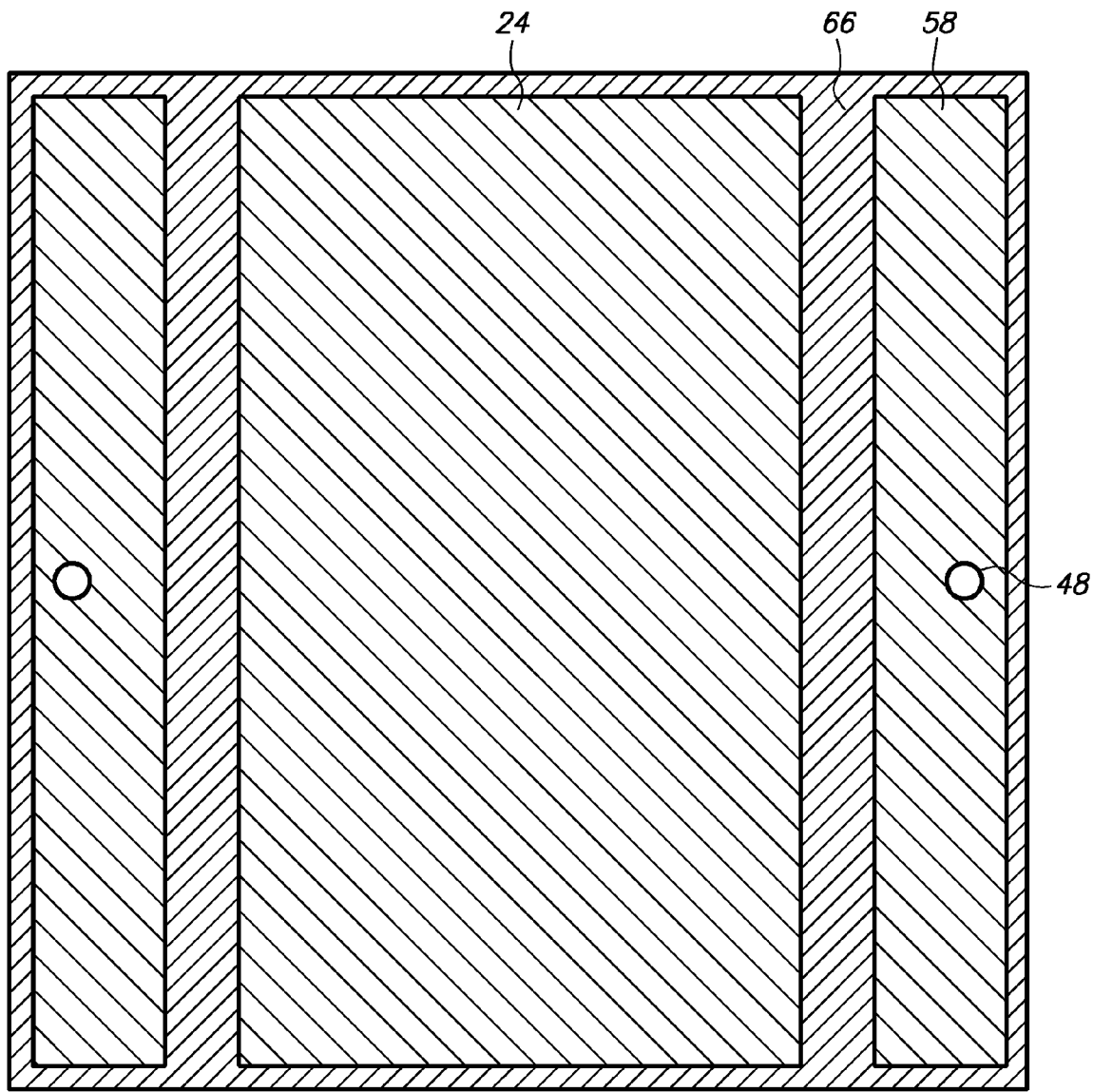

FIGS. 7A, 7B and 7C are cross-sectional, top and bottom views, respectively, of a thermal board with solder masks in accordance with an embodiment of the present invention.

In this embodiment, top and bottom solder masks selectively expose the conductive trace and the heat spreader. For purposes of brevity, any description of thermal board 70 is incorporated herein insofar as the same is applicable, and the same description need not be repeated. Likewise, elements of the thermal board similar to those in thermal board 70 have corresponding reference numerals.

Thermal board 76 includes adhesive 26, substrate 30, conductive trace 60, heat spreader 62 and solder masks 64 and 66. Substrate 30 includes dielectric layer 34. Conductive trace 60 includes plated through-hole 48, pad 54 and terminal 58. Heat spreader 62 includes post 22, base 24 and cap 56.

Solder mask 64 is an electrically insulative layer that selectively exposes pad 54 and cap 56 in the upward direction and covers dielectric layer 34 where it is otherwise exposed in the upward direction, and solder mask 66 is an electrically insulative layer that selectively exposes base 24 and terminal 58 in the downward direction and covers adhesive 26 where it is otherwise exposed in the downward direction.

Thermal board 76 can be manufactured in a manner similar to thermal board 70 with suitable adjustments for solder masks 64 and 66. For instance, adhesive 26 is mounted on base 24, substrate 30 is mounted on adhesive 26, heat and pressure are applied to flow and solidify adhesive 26, grinding is applied to planarize the top surface, hole 40 is drilled through the structure and then plated layers 44 and 46 and plated through-hole 48 are deposited on the structure as previously described. Thereafter, conductive layer 32 and plated layer 44 are etched to form pad 54 and cap 56 and base 24 and plated layer 46 are etched to form terminal 58, then solder mask 64 is formed on the top surface and solder mask 66 is formed on the bottom surface and then plated contacts 64 provide a surface finish for base 24, pad 54, cap 56 and terminal 58. Thereafter, adhesive 26, substrate 30 and solder masks 64 and 66 are cut or cracked at the peripheral edges of thermal board 76 to detach it from the batch.

Solder masks 64 and 66 are initially a photoimageable liquid resin that is dispensed on the top and bottom surfaces, respectively. Thereafter, solder masks 64 and 66 are patterned by selectively applying light through reticles (not shown) so that the solder mask portions exposed to the light are rendered insoluble, applying a developer solution to remove the solder mask portions that are unexposed to the light and remain soluble and then hard baking, as is conventional.

Figure 8A:
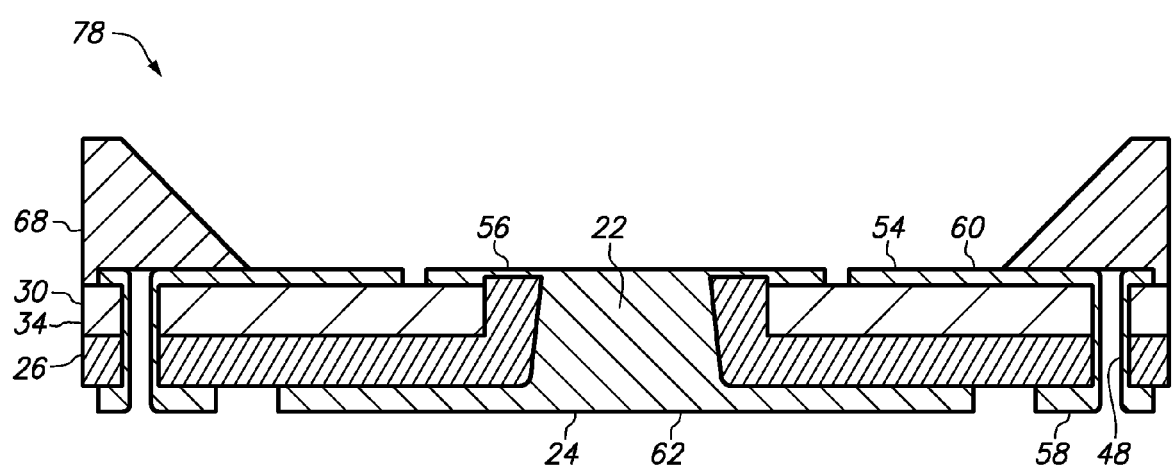
FIGS. 8A, 8B and 8C are cross-sectional, top and bottom views, respectively, of a thermal board with a rim in accordance with an embodiment of the present invention.
Figure 8B:
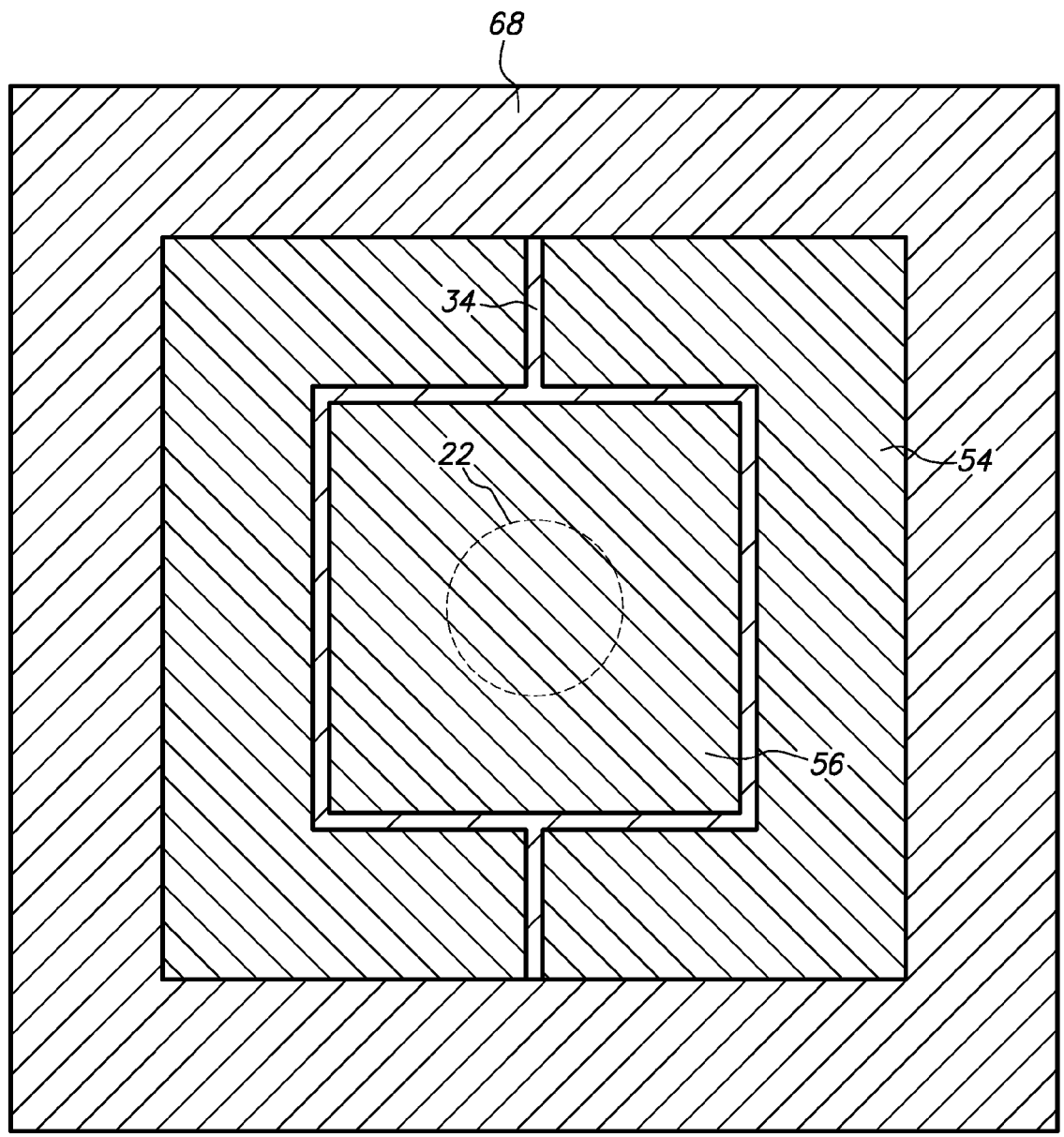
Figure 8C:
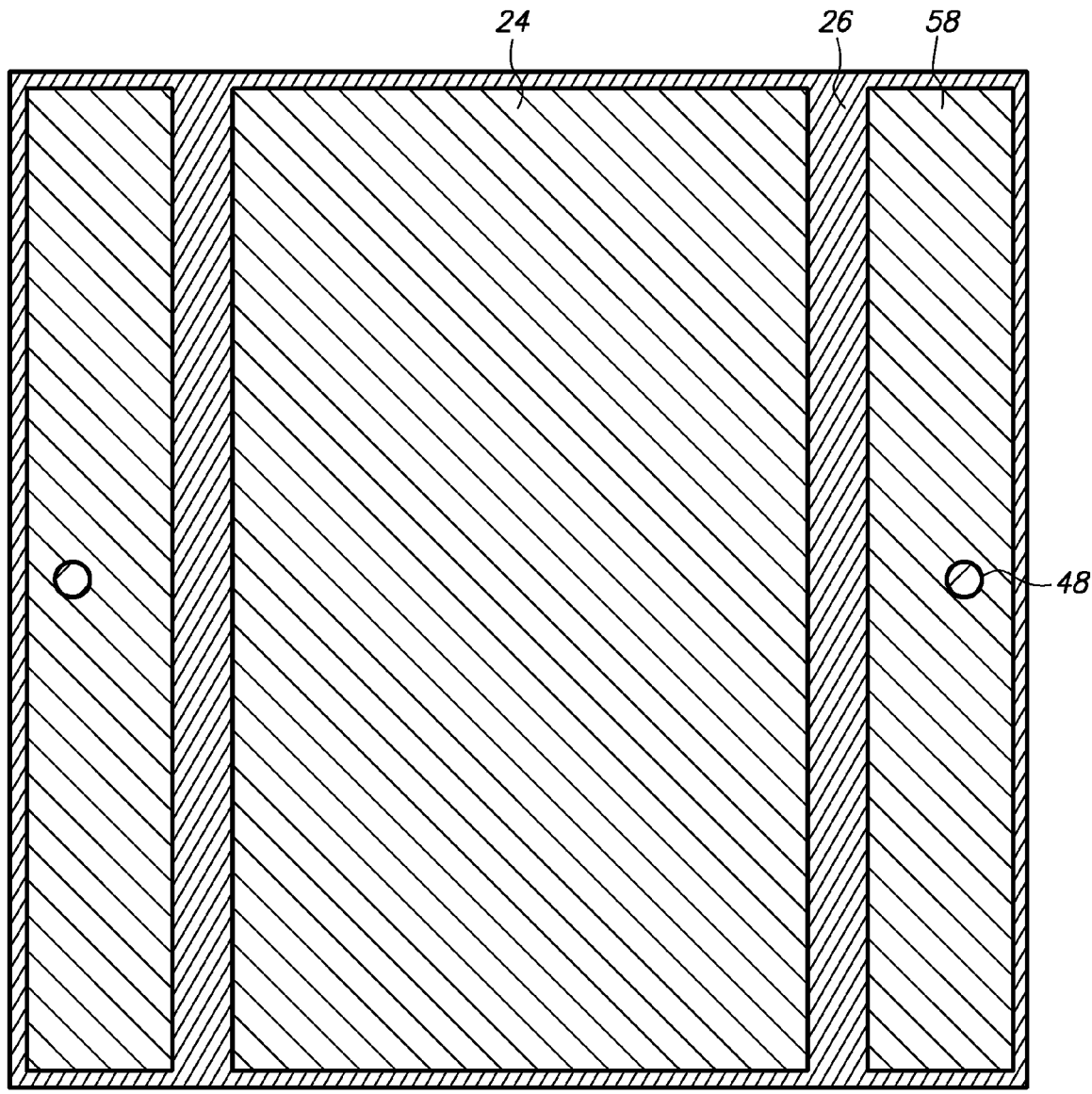

FIGS. 8A, 8B and 8C are cross-sectional, top and bottom views, respectively, of a thermal board with a rim in accordance with an embodiment of the present invention.

In this embodiment, a rim is mounted on the top surface. For purposes of brevity, any description of thermal board 70 is incorporated herein insofar as the same is applicable, and the same description need not be repeated. Likewise, elements of the thermal board similar to those in thermal board 70 have corresponding reference numerals.

Thermal board 78 includes adhesive 26, substrate 30, conductive trace 60, heat spreader 62 and rim 68. Substrate 30 includes dielectric layer 34. Conductive trace 60 includes plated through-hole 48, pad 54 and terminal 58. Heat spreader 62 includes post 22, base 24 and cap 56.

Rim 68 is a square shaped frame that contacts and extends above pad 54. Post 22 and cap 56 are centrally located within the periphery of rim 68. For instance, rim 68 has a height of 600 microns, a width (between its inner and outer sidewalls) of 1000 microns and is laterally spaced from cap 56 by 500 microns.

Rim 68 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 50 microns. Thus, rim 68 has a height of 600 microns (50+500+50).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 68 can include a metal ring on the adhesive film.

Thermal board 78 can be manufactured in a manner similar to thermal board 70 with suitable adjustments for rim 68. For instance, adhesive 26 is mounted on base 24, substrate 30 is mounted on adhesive 26, heat and pressure are applied to flow and solidify adhesive 26, grinding is applied to planarize the top surface, hole 40 is drilled through the structure and then plated layers 44 and 46 and plated through-hole 48 are deposited on the structure as previously described. Thereafter, conductive layer 32 and plated layer 44 are etched to form pad 54 and cap 56 and base 24 and plated layer 46 are etched to form terminal 58, then rim 68 is mounted on the top surface and then plated contacts 64 provide a surface finish for base 24, pad 54, cap 56 and terminal 58. Thereafter, adhesive 26 and substrate 30 are cut or cracked at the peripheral edges of thermal board 78 to detach it from the batch.

Figure 9A:
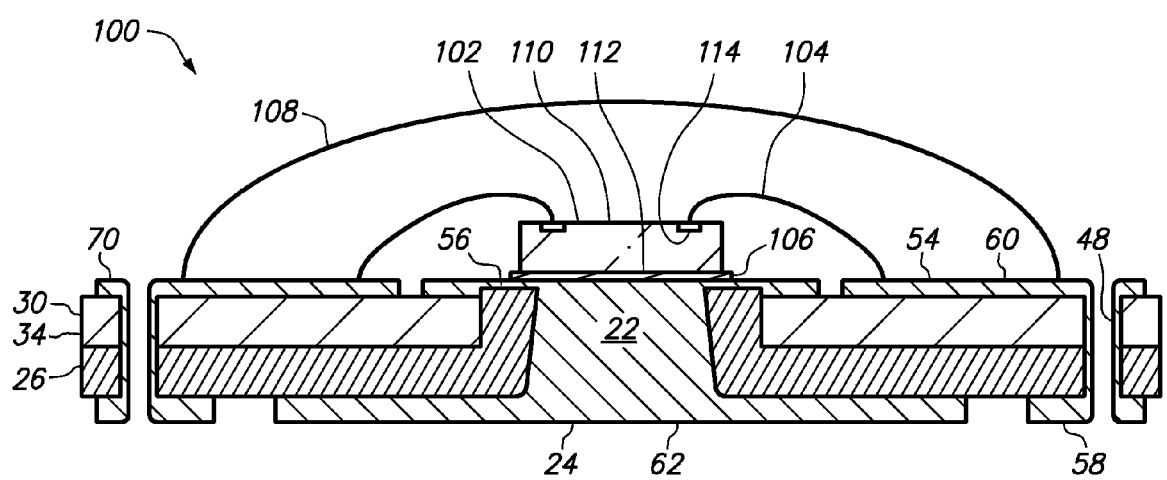
FIGS. 9A, 9B and 9C are cross-sectional, top and bottom views, respectively, of a semiconductor chip assembly that includes a thermal board, a semiconductor device and an encapsulant in accordance with an embodiment of the present invention.
Figure 9B:
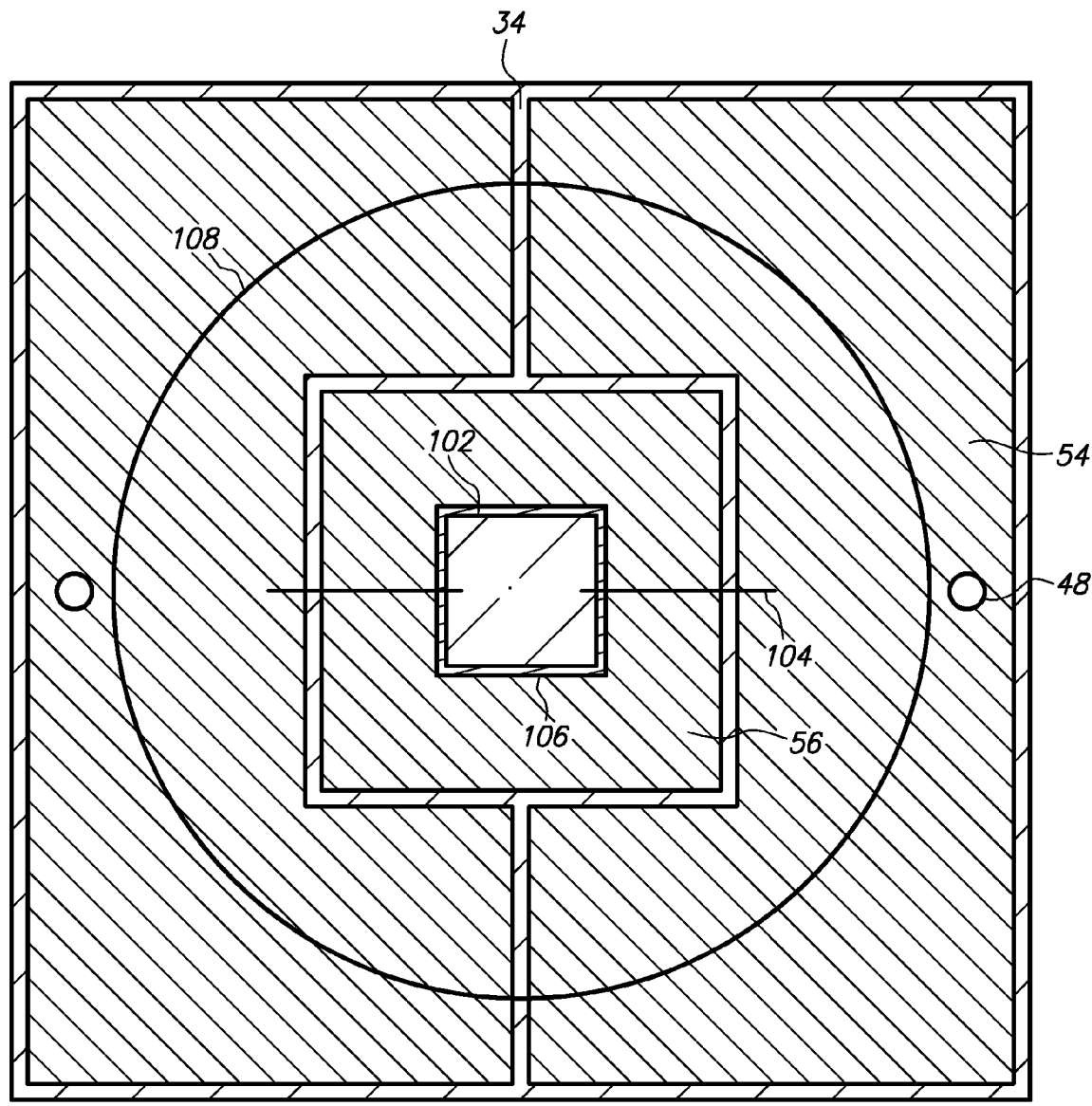
Figure 9C:
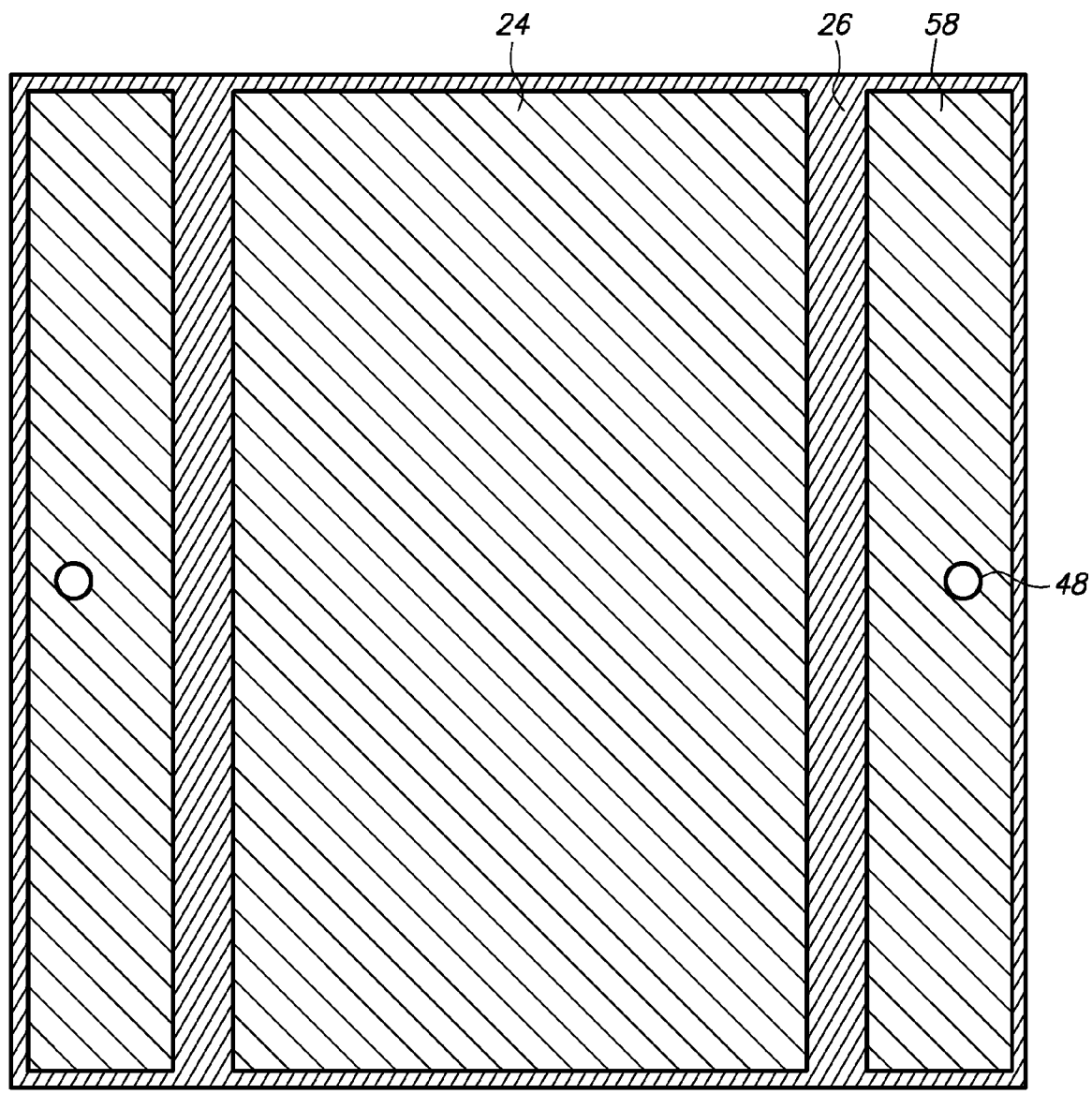

FIGS. 9A, 9B and 9C are cross-sectional, top and bottom views, respectively, of a semiconductor chip assembly that includes a thermal board, a semiconductor device and an encapsulant in accordance with an embodiment of the present invention.

In this embodiment, the semiconductor device is an LED chip that emits blue light, is mounted on the post, is electrically connected to the pad using a wire bond and is thermally connected to the post using a die attach. The semiconductor device is covered by a color-shifting encapsulant that converts the blue light to white light.

Semiconductor chip assembly 100 includes thermal board 70, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is the thermal contact surface.

LED chip 102 is mounted on heat spreader 62, electrically connected to conductive trace 60 and thermally connected to heat spreader 62. In particular, LED chip 102 is mounted on cap 56 (and thus post 22), overlaps post 22 but does not overlap substrate 30 or conductive trace 60, is electrically connected to pad 54 by wire bond 104 and is thermally connected to and mechanically attached to cap 56 by die attach 106.

For instance, wire bond 104 is bonded to and electrically connects pads 54 and 114, thereby electrically connecting LED chip 102 to terminal 58. Die attach 106 contacts and is sandwiched between and thermally connects and mechanically attaches cap 56 and thermal contact surface 112, thereby thermally connecting LED chip 102 to post 22, thereby thermally connecting LED chip 102 to base 24.

Encapsulant 108 is a solid adherent electrically insulative color-shifting protective enclosure that provides environmental protection such as moisture resistance and particle protection for LED chip 102 and wire bond 104. Encapsulant 108 contacts dielectric layer 34, pad 54, cap 56, LED chip 102, wire bond 104 and die attach 106, is spaced from post 22, base 24, adhesive 26, plated through-hole 48 and terminal 58 and covers post 22, base 24, cap 56, LED chip 102, wire bond 104 and die attach 106 in the upward direction. Encapsulant 108 is transparent for convenience of illustration.

Pad 54 is spot plated with nickel/silver to bond well with wire bond 104, thereby improving signal transfer from conductive trace 60 to LED chip 102, and cap 56 is spot plated with nickel/silver to bond well with die attach 106, thereby improving heat transfer from LED chip 102 to heat spreader 62. Pad 54 and cap 56 also provide a highly reflective surface which reflects the light emitted towards the silver surface layer by LED chip 102, thereby increasing light output in the upward direction. Furthermore, since cap 56 is shaped and sized to accommodate thermal contact surface 112, post 22 is not and need not be shaped and sized to accommodate thermal contact surface 112.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor. For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on cap 56 using die attach 106, then wire bonding pads 54 and 114 and then forming encapsulant 108.

For instance, die attach 106 is initially a silver-filled epoxy paste with high thermal conductivity that is selectively screen printed on cap 56 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 54 and 114 and then encapsulant 108 is molded on the structure.

LED chip 102 can be electrically connected to pad 54 by a wide variety of connection media, thermally connected to and mechanically attached to heat spreader 62 by a wide variety of thermal adhesives and encapsulated by a wide variety of encapsulants.

Semiconductor chip assembly 100 is a first-level single-chip package.

Figure 10A:
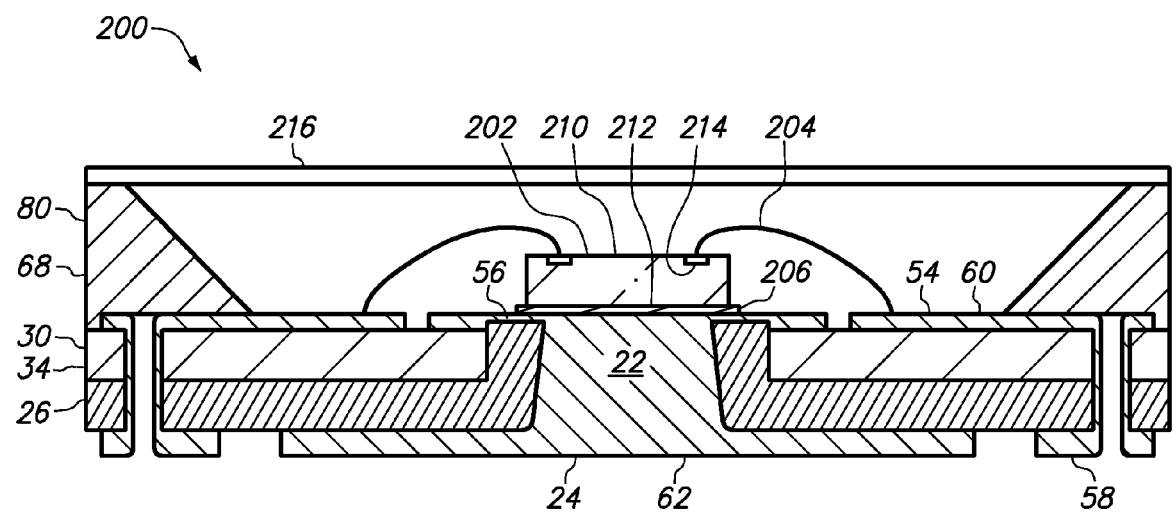
FIGS. 10A, 10B and 10C are cross-sectional, top and bottom views, respectively, of a semiconductor chip assembly that includes a thermal board with a rim, a semiconductor device and a lid in accordance with an embodiment of the present invention.
Figure 10B:
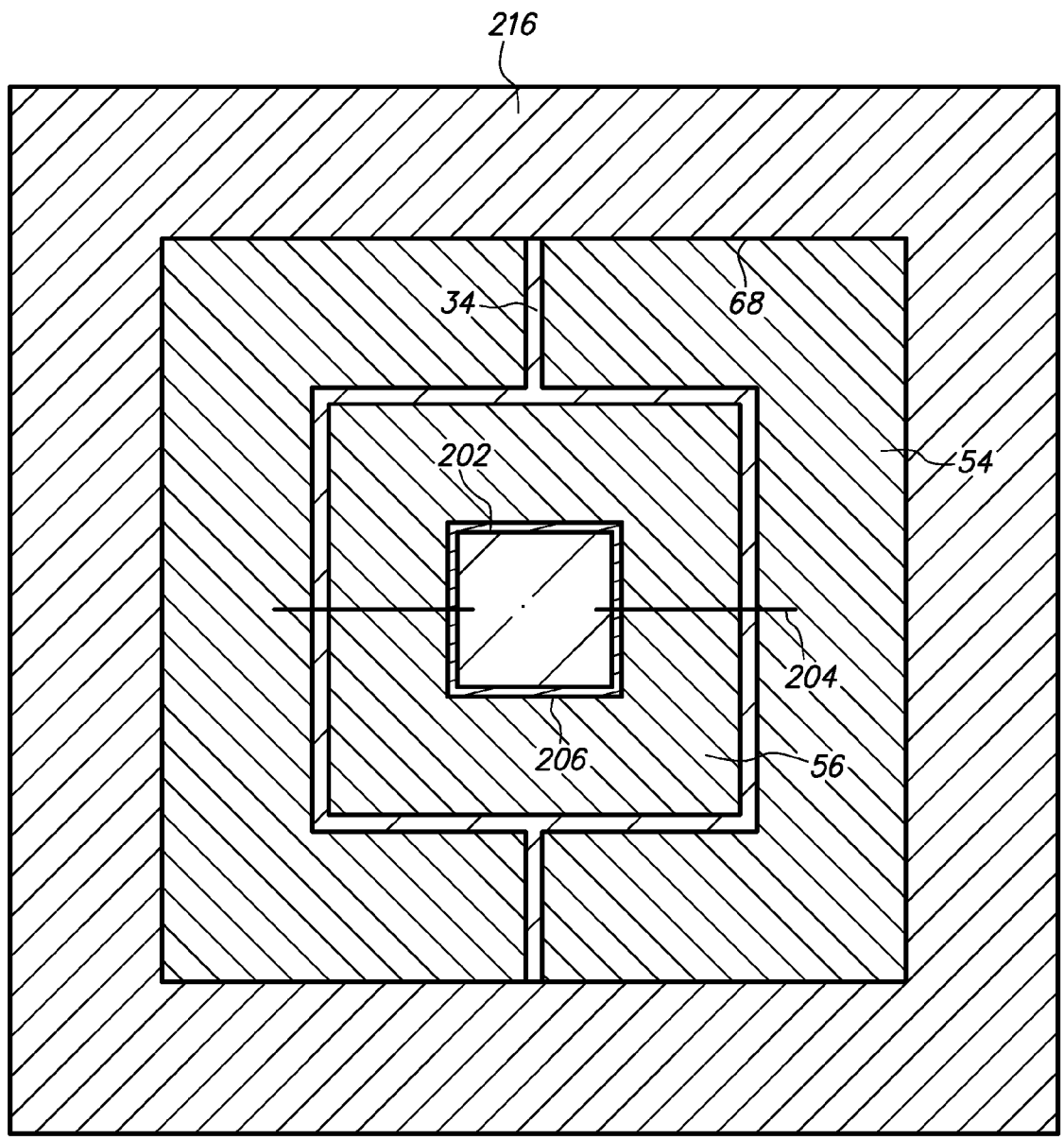
Figure 10C:
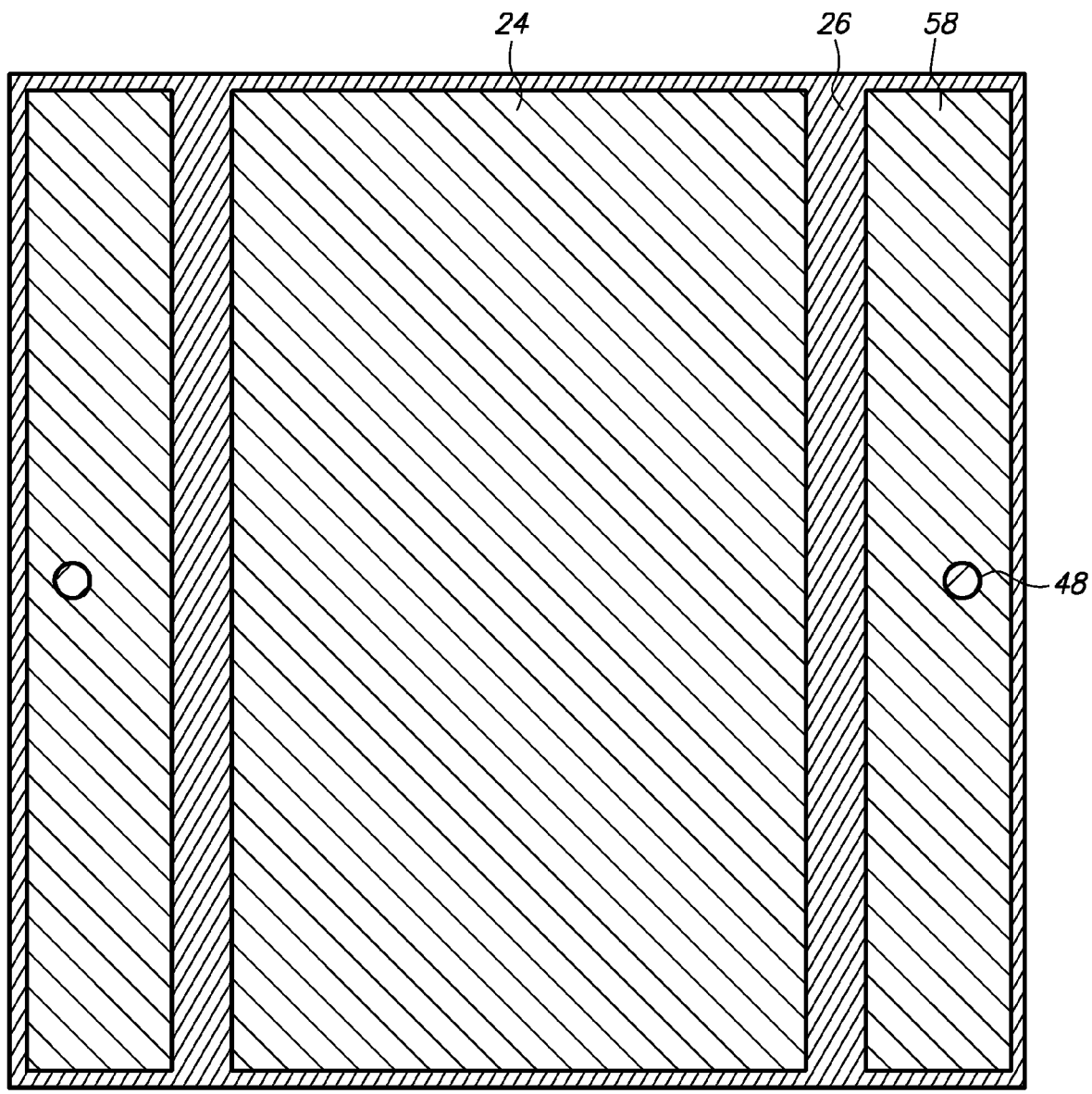

FIGS. 10A, 10B and 10C are cross-sectional, top and bottom views, respectively, of a semiconductor chip assembly that includes a thermal board with a rim, a semiconductor device and a lid in accordance with an embodiment of the present invention.

In this embodiment, the lid is mounted on the rim and the encapsulant is omitted. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 78, LED chip 202, wire bond 204, die attach 206 and lid 216. LED chip 202 includes top surface 210, bottom surface 212 and bond pad 214. Top surface 210 is the active surface and includes bond pad 214 and bottom surface 212 is the thermal contact surface.

LED chip 202 is mounted on heat spreader 62, electrically connected to conductive trace 60 and thermally connected to heat spreader 62. In particular, LED chip 202 is mounted on cap 56, overlaps post 22 but does not overlap substrate 30 or conductive trace 60, is electrically connected to pad 54 by wire bond 204 and is thermally connected to and mechanically attached to cap 56 by die attach 206.

Lid 216 is a glass sheet that is mounted on rim 68, thereby forming a sealed enclosure for LED chip 202 and wire bond 204 in an air cavity. Furthermore, lid 216 is transparent and does not color-shift light.

LED chip 202 emits white light which in turn radiates through lid 216 and assembly 200 is a white light source.

Semiconductor chip assembly 200 can be manufactured by mounting LED chip 202 on cap 56 using die attach 206, then wire bonding pads 54 and 214 and then mounting lid 216 on rim 68.

Semiconductor chip assembly 200 is a first-level single-chip package.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the thermal board can include single-level conductive traces and multi-level conductive traces. The thermal board can also include multiple posts arranged in an array for multiple semiconductor devices and additional conductive traces to accommodate the additional semiconductor devices. The thermal board can also include a solder mask that extends above and selectively exposes the pad and the cap and the rim mounted on the solder mask. The thermal board can also include the plated through-hole at a peripheral edge and the rim mounted on the plated-through-hole. The semiconductor device can be flip-chip bonded to the pad and the cap by solder joints, overlap the pad and cover the post in the upward direction. The semiconductor device can be covered in the upward direction by a transparent, translucent or opaque encapsulant and/or a transparent, translucent or opaque lid. For instance, the semiconductor device can be an LED chip that emits blue light and is covered by a transparent encapsulant or lid so that the assembly is a blue light source or a color-shifting encapsulant or lid so that the assembly is a green, red or white light source. Likewise, the semiconductor device can be an LED package with multiple LED chips and the thermal board can include additional conductive traces to accommodate the additional LED chips.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the post and the thermal board can include additional conductive traces to receive and route additional wire bonds to the chips. This may be more cost effective than providing a miniature post for each chip.

The semiconductor chip can be optical or non-optical. For instance, the chip can be an LED, an IR detector, a solar cell, a microprocessor, a controller, a DRAM or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a post and a base that are integral with one another and a cap that is metallurgically bonded and thermally connected to the post, thereby enhancing reliability and reducing cost. The cap can be coplanar with the pad, thereby facilitating the electrical, thermal and mechanical connections with the semiconductor device. Furthermore, the cap can be customized for the semiconductor device and the base can be customized for the next level assembly, thereby enhancing the thermal connection from the semiconductor device to the next level assembly. For instance, the cap can have a square or rectangular shape in a lateral plane with the same or similar topography as the thermal contact of the semiconductor device. In any case, the heat spreader can be a wide variety of thermally conductive structures.

The heat spreader can be electrically connected to or isolated from the conductive trace. For instance, a routing line above the adhesive and the dielectric layer can electrically connect the pad and the cap, a routing line below the adhesive and the dielectric layer can electrically connect the base and the terminal or the pad and the cap can be merged. Thereafter, the terminal can be electrically connected to ground, thereby electrically connecting the cap to ground.

The post can be deposited on or integral with the base. The post can be integral with the base when they are a single-piece metal such as copper or aluminum. The post can also be integral with the base when they include a single-piece metal such as copper at their interface as well as additional metal elsewhere such as a solder upper post portion and a copper lower post portion and base. The post can also be integral with the base when they share single-piece metals at their interface such as a copper coating on a nickel buffer layer on an aluminum core.

The post can include a flat top surface that is coplanar with the adhesive. For instance, the post can be coplanar with the adhesive or the post can be etched after the adhesive is solidified to provide a cavity in the adhesive over the post. The post can also be selectively etched to provide a cavity in the post that extends below its top surface. In any case, the semiconductor device can be mounted on the post and located in the cavity, and the wire bond can extend from the semiconductor device in the cavity to the pad outside the cavity. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding. Furthermore, the base can include fins at its backside that protrude in the downward direction. For instance, the base can be cut at its bottom surface by a routing machine to form lateral grooves that define the fins. In this instance, the base can have a thickness of 500 microns, the grooves can have a depth of 300 microns and the fins can have a height of 300 microns. The fins can increase the surface area of the base, thereby increasing the thermal conductivity of the base by thermal convection when it remains exposed to the air rather than mounted on a heat sink.

The cap can be formed by numerous deposition techniques including electroplating, electroless plating, evaporating and sputtering as a single layer or multiple layers after the adhesive is solidified. The cap can be the same metal as the post or the adjacent top of the post. Furthermore, the cap can extend across the aperture to the substrate or reside within the periphery of the aperture. Thus, the cap can contact or be spaced from the substrate. In any case, the cap extends upwardly from the top of the post.

The adhesive can provide a robust mechanical bond between the heat spreader and the substrate. For instance, the adhesive can extend laterally from the post beyond the conductive trace to the peripheral edges of the assembly, the adhesive can fill the space between the post spreader and the dielectric layer and the adhesive can be void-free with consistent bond lines. The adhesive can also absorb thermal expansion mismatch between the heat spreader and the substrate. The adhesive can also be the same material as or a different material than the dielectric layer. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error. Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the aperture can be formed in the conductive layer and then the conductive layer can be mounted on the adhesive so that the conductive layer contacts the adhesive and is exposed in the upward direction and the post extends into and is exposed in the upward direction by the aperture. In this instance, the conductive layer can have a thickness of 100 to 200 microns such as 125 microns which is thick enough to handle without warping and wobbling yet thin enough to pattern without excessive etching.

The conductive layer and the dielectric layer can be mounted on the adhesive. For instance, the conductive layer can be provided on the dielectric layer, then the aperture can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the post extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the post is aligned with the aperture and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned for the pad and the cap. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the cap can be coplanar at their top surfaces, thereby enhancing solder joints between the semiconductor device and the thermal board by controlling solder ball collapse.

The pad and the terminal can have a wide variety of packaging formats as required by the semiconductor device and the next level assembly.

The pad and the terminal can be formed by numerous deposition techniques including electroplating, electroless plating, evaporating and sputtering as a single layer or multiple layers, either before or after the substrate is mounted on the adhesive. For instance, the conductive layer can be patterned on the substrate to provide the pad before it is mounted on the adhesive or after it is attached to the post and the base by the adhesive. Likewise, the base can be patterned to provide the terminal before the plated through-hole is formed.

The plated contact surface finish can be formed before or after the pad and the terminal are formed. For instance, the plated contacts can be deposited on the base and the conductive layer before or after they are etched to form the pad, the terminal and the cap.

The rim can be reflective or non-reflective and transparent or non-transparent. For instance, the rim can include a highly reflective metal such as silver or aluminum with a slanted inner surface which reflects the light directed at it in the upward direction, thereby increasing light output in the upward direction. Likewise, the rim can include a transparent material such as glass or a non-reflective, non-transparent low cost material such as epoxy. Furthermore, a reflective rim can be used regardless of whether it contacts or confines the encapsulant.

The encapsulant can be numerous transparent, translucent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

The lid can overlap or replace the encapsulant. The lid can provide environmental protection such as moisture resistance and particle protection for the chip and the wire bond in a sealed enclosure. The lid can be numerous transparent, translucent or opaque materials and have various shapes and sizes. For instance, the lid can be transparent glass or silica.

A lens can overlap or replace the encapsulant. The lens can provide environmental protection such as moisture resistance and particle protection for the chip and the wire bond in a sealed enclosure. The lens can also provide a convex refractive surface that focuses the light in the upward direction. The lens can be numerous transparent, translucent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, plated through-holes, routing lines and vias as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The cap, dielectric layer, upper and lower plated layers, plated contacts, solder masks and rim are generally desirable but may be omitted in some embodiments. For instance, if the opening and the aperture are punched rather than drilled so that the top of the post is shaped and sized to accommodate a thermal contact surface of the semiconductor device then the cap can be omitted. If single-level horizontal signal routing is used then the dielectric layer can be omitted. Likewise, if a reflector is unnecessary then the rim can be omitted.

The thermal board can include a thermal via that is spaced from the post, extends through the dielectric layer and the adhesive outside the opening and the aperture and is adjacent to and thermally connects the base and the cap to improve heat dissipation from the cap to the base and heat spreading in the base.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive, a single substrate and a single plated layer and then separated from one another. Likewise, numerous sets of heat spreaders and conductive traces that are each dedicated to a single semiconductor device can be simultaneously batch manufactured for each thermal board in the batch using a single metal plate, a single adhesive, a single substrate and a single plated layer.

For example, multiple recesses can be etched in the metal plate to form multiple posts and the base, then the non-solidified adhesive with openings corresponding to the posts can be mounted on the base such that each post extends through an opening, then the substrate (with a single conductive layer, a single dielectric layer and apertures corresponding to the posts) can be mounted on the adhesive such that each post extends through an opening into an aperture, then the base and the substrate can be moved towards one another by platens to force the adhesive into the gaps in the apertures between the posts and the substrate, then the adhesive can be cured and solidified, then the posts, the adhesive and the conductive layer can be grinded to form a lateral top surface, then the holes can be drilled through the structure, then the plated layer can be plated on the structure to form the upper and lower plated layers and the plated through-holes in the holes, then the conductive layer and the upper plated layer can be etched to form the caps corresponding to the posts and the pads corresponding to the plated through-holes, the base and the lower plated layer can be etched to form the bases corresponding to the posts and the terminals corresponding to the plated through-holes, then the plated contact surface finish can be formed on the bases, the caps, the pads and the terminals and then the substrate and the adhesive can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the caps, then LED packages can be placed on the solder paste portions, then the solder paste portions can be simultaneously heated, reflowed and hardened to provide the solder joints and then the thermal boards can be separated from one another.

As another example, die attach paste portions can be deposited on the caps, then chips can be placed on the die attach paste portions, then the die attach paste portions can be simultaneously heated and hardened to provide the die attaches, then the chips can be wired bonded to the corresponding pads, then the encapsulants can be formed over the chips and the wire bonds and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the post since an imaginary vertical line intersects the semiconductor device and the post, regardless of whether another element such as the cap or the die attach is between the semiconductor device and the post and is intersected by the line, and regardless of whether another imaginary vertical line intersects the post but not the semiconductor device (outside the periphery of the semiconductor device). Likewise, the adhesive overlaps the base and is overlapped by the pad, and the base is overlapped by the post. Likewise, the post overlaps and is within a periphery of the base. Moreover, overlap is synonymous with over and overlapped by is synonymous with under or beneath.

The term "contact" refers to direct contact. For instance, the dielectric layer contacts the pad but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "plated through-hole" in conjunction with the conductive trace refers to an electrical interconnect that is formed in a hole using plating. For instance, the plated through-hole exists regardless of whether it remains intact in the hole and spaced from peripheral edges of the assembly or is subsequently split or trimmed such that the hole is converted into a groove and the remaining portion is in the groove at a peripheral edge of the assembly.

The term "cap" in conjunction with the heat spreader refers to a contact region that is adapted to contact and/or bond to external connection media (such as solder or thermally conductive adhesive) that thermally connects the heat spreader to the semiconductor device.

The terms "opening" and "aperture" and "hole" refer to a through-hole and are synonymous. For instance, the post is exposed by the adhesive in the upward direction when it is inserted into the opening in the adhesive. Likewise, the post is exposed by the substrate in the upward direction when it is inserted into the aperture in the substrate.

The term "inserted" refers to relative motion between elements. For instance, the post is inserted into the aperture regardless of whether the post is stationary and the substrate moves towards the base, the substrate is stationary and the post moves towards the substrate or the post and the substrate both approach the other. Furthermore, the post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the post is aligned with the aperture when the adhesive is mounted on the base, the substrate is mounted on the adhesive, the post is inserted into and aligned with the opening and the aperture is aligned with the opening regardless of whether the post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the post and the dielectric layer in the gap refers to the adhesive in the gap that contacts and is sandwiched between the post at the inner sidewall of the gap and the dielectric layer at the outer sidewall of the gap.

The term "above" refers to upward extension and includes adjacent and non-adjacent elements as well as overlapping and non-overlapping elements. For instance, the post extends above, is adjacent to, overlaps and protrudes from the base. Likewise, the post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post. Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the post extends vertically above the base in the upward direction and the adhesive extends vertically below the pad in the downward direction regardless of whether the assembly is inverted and/or mounted on a heat sink. Likewise, the base extends "laterally" from the post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a semiconductor chip assembly, comprising:
   providing a post and a base, wherein the post is adjacent to and integral with the base and extends above the base in an upward direction, and the base extends below the post in a downward direction opposite the upward direction and extends laterally from the post in lateral directions orthogonal to the upward and downward directions;
   providing an adhesive, wherein an opening extends through the adhesive;
   providing a conductive layer, wherein an aperture extends through the conductive layer;
   mounting the adhesive on the base, including inserting the post into the opening, wherein the adhesive extends above the base and the post extends into the opening;
   mounting the conductive layer on the adhesive, including aligning the post with the aperture, wherein the conductive layer extends above the adhesive and the adhesive is sandwiched between the base and the conductive layer and is non-solidified; then
   applying heat to melt the adhesive;
   moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;
   applying heat to solidify the molten adhesive, thereby mechanically attaching the post and the base to the conductive layer; then
   providing a plated through-hole;
   providing a conductive trace that includes a pad, a terminal, the plated through-hole and selected portions of the conductive layer and the base, wherein the terminal is coplanar with the base and an electrically conductive path between the pad and the terminal includes the plated through-hole;
   providing a cap that is adjacent to and covers in the upward direction and extends laterally from a top of the post and that contacts and overlaps the adhesive and includes a selected portion of the conductive layer; then
   mounting a semiconductor device on a heat spreader that includes the post, the base and the cap;
   electrically connecting the semiconductor device to the pad, thereby electrically connecting the semiconductor device to the terminal; and
   thermally connecting the semiconductor device to the post, the base and the cap.

2. The method of claim 1, wherein providing the post and the base includes:
   providing a metal plate;
   forming an etch mask on the metal plate that selectively exposes the metal plate and defines the post;
   etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
   removing the etch mask.

3. The method of claim 1, wherein:
   providing the adhesive includes providing a prepreg with uncured epoxy;
   flowing the adhesive includes melting the uncured epoxy and compressing the uncured epoxy between the base and the conductive layer; and
   solidifying the adhesive includes curing the uncured epoxy.

4. The method of claim 1, wherein flowing the adhesive includes filling the gap with the adhesive.

5. The method of claim 1, wherein mounting the conductive layer includes mounting the conductive layer alone on the adhesive.

6. The method of claim 1, wherein mounting the conductive layer includes mounting the conductive layer and a dielectric layer on the adhesive such that the dielectric layer is sandwiched between the conductive layer and the adhesive and the aperture extends through the conductive layer and the dielectric layer, and moving the base and the conductive layer towards one another includes moving the post upward in the aperture and forcing the molten adhesive upward in the aperture such that the post and the adhesive extend above the dielectric layer.

7. The method of claim 1, wherein providing the pad and the cap includes removing selected portions of the conductive layer using an etch mask that defines the pad and the cap after forming the plated through-hole.

8. The method of claim 1, wherein providing the pad and the cap includes:
grinding the post, the adhesive and the conductive layer such that the post, the adhesive and the conductive layer are laterally aligned with one another at a top lateral surface that faces in the upward direction; then
depositing a plated layer on the post, the adhesive and the conductive layer; and then
removing selected portions of the conductive layer and the plated layer using an etch mask that defines the pad and the cap.

9. The method of claim 1, wherein providing the terminal includes removing selected portions of the base using an etch mask that defines the terminal thereby trimming the base after forming the plated through-hole.

10. The method of claim 1, wherein mounting the semiconductor device includes providing a die attach between the semiconductor device and the cap, electrically connecting the semiconductor device includes providing a wire bond between the semiconductor device and the pad, and thermally connecting the semiconductor device includes providing the die attach between the semiconductor device and the cap.

11. A method of making a semiconductor chip assembly, comprising:
providing a post, a base, an adhesive and a substrate, wherein
the post is adjacent to the base, extends above the base in an upward direction, extends into an opening in the adhesive and is aligned with an aperture in the substrate,
the base covers the post in a downward direction opposite the upward direction and extends laterally from the post in lateral directions orthogonal to the upward and downward directions,
the adhesive is mounted on and extends above the base, is sandwiched between the base and the substrate and is non-solidified, and
the substrate is mounted on and extends above the adhesive, wherein the substrate includes a conductive layer and a dielectric layer and the conductive layer extends above the dielectric layer; then
flowing the adhesive into and upward in a gap located in the aperture between the post and the substrate;
solidifying the adhesive; then
providing a plated through-hole that extends through the conductive layer, the dielectric layer, the adhesive and the base; then
providing a conductive trace that includes a pad, a terminal and the plated through-hole, wherein the pad includes a selected portion of the conductive layer, the terminal includes a selected portion of the base that is spaced and separated from and no longer part of the base, the terminal has the same thickness as and is coplanar with the base and an electrically conductive path between the pad and the terminal includes the plated through-hole;
providing a cap that is adjacent to and covers in the upward direction and extends laterally from a top of the post and that contacts and overlaps the adhesive and the dielectric layer and includes a selected portion of the conductive layer; then mounting a semiconductor device on the cap, wherein a heat spreader includes the post, the base and the cap and the semiconductor device overlaps the post, the base and the cap;
electrically connecting the semiconductor device to the pad, thereby electrically connecting the semiconductor device to the terminal; and
thermally connecting the semiconductor device to the cap, thereby thermally connecting the semiconductor device to the base.

12. The method of claim 11, wherein providing the post and the base includes:
providing a metal plate;
forming an etch mask on the metal plate that selectively exposes the metal plate and defines the post;
etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
removing the etch mask.

13. The method of claim 11, wherein:
providing the adhesive includes providing a prepreg with uncured epoxy;
flowing the adhesive includes melting the uncured epoxy and compressing the uncured epoxy between the base and the substrate; and
solidifying the adhesive includes curing the uncured epoxy.

14. The method of claim 11, wherein flowing the adhesive includes filling the gap with the adhesive.

15. The method of claim 11, wherein providing the pad and the cap includes:
grinding the post, the adhesive and the conductive layer such that the post, the adhesive and the conductive layer are laterally aligned with one another at a top lateral surface that faces in the upward direction; then
depositing a plated layer on the post, the adhesive and the conductive layer; and then
removing selected portions of the conductive layer and the plated layer using an etch mask that defines the pad and the cap.

16. The method of claim 11, wherein providing the pad and the plated through-hole includes:
drilling a hole through the conductive layer, the dielectric layer, the adhesive and the base after solidifying the adhesive; then
depositing a plated layer on the post, the conductive layer, the adhesive and the base and into the hole, wherein the plated layer forms an upper plated layer that covers the post in the upward direction and the plated through-hole in the hole; then
forming an etch mask on the upper plated layer that defines the pad;
etching the conductive layer and the upper plated layer in a pattern defined by the etch mask; and then
removing the etch mask.

17. The method of claim 11, wherein providing the terminal includes removing selected portions of the base using an etch mask that defines the terminal thereby trimming the base after forming the plated through-hole.

18. The method of claim 11, wherein providing the terminal and the plated through-hole includes:
   drilling a hole through the conductive layer, the dielectric layer, the adhesive and the base after solidifying the adhesive; then
   depositing a plated layer on the conductive layer, the adhesive and the base and into the hole, wherein the plated layer forms a lower plated layer that covers the post in the downward direction and the plated through-hole in the hole; then
   forming an etch mask on the lower plated layer that defines the terminal;
   etching the base and the lower plated layer in a pattern defined by the etch mask; and then
   removing the etch mask.

19. The method of claim 11, wherein providing the pad, the terminal, the cap and the plated through-hole includes:
   drilling a hole through the conductive layer, the dielectric layer, the adhesive and the base after solidifying the adhesive; then
   depositing a plated layer on the post, the conductive layer, the adhesive and the base and into the hole, wherein the plated layer forms an upper plated layer that covers the post in the upward direction, a lower plated layer that covers the post in the downward direction and the plated through-hole in the hole; then
   forming a first etch mask on the upper plated layer that defines the pad and the cap;
   etching the conductive layer and the upper plated layer in a pattern defined by the first etch mask;
   forming a second etch mask on the lower plated layer that defines the terminal;
   etching the base and the lower plated layer in a pattern defined by the second etch mask; and
   removing the etch masks.

20. The method of claim 11, wherein mounting the semiconductor device includes providing a die attach between the semiconductor device and the cap, electrically connecting the semiconductor device includes providing a wire bond between the semiconductor device and the pad, and thermally connecting the semiconductor device includes providing the die attach between the semiconductor device and the cap.

21. A method of making a semiconductor chip assembly, comprising:
   providing a post and a base, wherein the post is adjacent to and integral with the base and extends above the base in an upward direction, and the base covers the post in a downward direction opposite the upward direction and extends laterally from the post in lateral directions orthogonal to the upward and downward directions;
   providing an adhesive, wherein an opening extends through the adhesive;
   providing a substrate that includes a conductive layer and a dielectric layer, wherein an aperture extends through the substrate;
   mounting the adhesive on the base, including inserting the post through the opening, wherein the adhesive extends above the base and the post extends through the opening;
   mounting the substrate on the adhesive, including inserting the post into the aperture, wherein the substrate extends above the adhesive, the conductive layer extends above the dielectric layer, the post extends through the opening into the aperture and the adhesive is sandwiched between the base and the substrate and is non-solidified; then
   applying heat to melt the adhesive;
   moving the base and the substrate towards one another, thereby moving the post upward in the aperture and applying pressure to the molten adhesive between the base and the substrate, wherein the pressure forces the molten adhesive to flow into and upward in a gap located in the aperture between the post and the substrate;
   applying heat to solidify the molten adhesive, thereby mechanically attaching the post and the base to the substrate; then
   providing a plated through-hole that extends through the conductive layer, the dielectric layer, the adhesive and the base; then
   providing a conductive trace that includes a pad, a terminal and the plated through-hole, wherein the pad includes a selected portion of the conductive layer, the terminal includes a selected portion of the base that is spaced and separated from and no longer part of the base, the terminal has the same thickness as and is coplanar with the base and an electrically conductive path between the pad and the terminal includes the plated through-hole;
   providing a cap that is adjacent to and covers in the upward direction and extends laterally from a top of the post and that contacts and overlaps the adhesive and the dielectric layer and includes a selected portion of the conductive layer; then
   mounting a semiconductor device on the cap, wherein a heat spreader includes the post, the base and the cap and the semiconductor device overlaps the post, the base and the cap;
   electrically connecting the semiconductor device to the pad, thereby electrically connecting the semiconductor device to the terminal; and
   thermally connecting the semiconductor device to the cap, thereby thermally connecting the semiconductor device to the base.

22. The method of claim 21, wherein providing the post and the base includes:
   providing a metal plate;
   forming an etch mask on the metal plate that selectively exposes the metal plate and defines the post;
   etching the metal plate in a pattern defined by the etch mask, thereby forming a recess in the metal plate that extends into but not through the metal plate, wherein the post includes an unetched portion of the metal plate that protrudes above the base and is laterally surrounded by the recess and the base includes an unetched portion of the metal plate below the post and the recess; and then
   removing the etch mask.

23. The method of claim 21, wherein:
   providing the adhesive includes providing a prepreg with uncured epoxy;
   flowing the adhesive includes melting the uncured epoxy and compressing the uncured epoxy between the base and the substrate; and
   solidifying the adhesive includes curing the uncured epoxy.

24. The method of claim 21, wherein providing the pad, the terminal, the cap and the plated through-hole includes:
   drilling a hole through the conductive layer, the dielectric layer, the adhesive and the base after solidifying the adhesive; then
   depositing a plated layer on the post, the conductive layer, the adhesive and the base and into the hole, wherein the plated layer forms an upper plated layer that covers the post in the upward direction, a lower plated layer that covers the post in the downward direction and the plated through-hole in the hole; then forming a first etch mask on the upper plated layer that defines the pad and the cap;

etching the conductive layer and the upper plated layer in a pattern defined by the first etch mask, thereby exposing the dielectric layer in the upward direction without exposing the adhesive in the upward direction, wherein the pad and the cap include unetched portions of the conductive layer and the upper plated layer;

forming a second etch mask on the lower plated layer that defines the terminal;

etching the base and the lower plated layer in a pattern defined by the second etch mask, thereby exposing the adhesive in the downward direction without exposing the dielectric layer in the downward direction, wherein the terminal includes unetched portions of the base and the lower plated layer; and removing the etch masks.

25. The method of claim 21, wherein mounting the semiconductor device includes providing a die attach between the semiconductor device and the cap, electrically connecting the semiconductor device includes providing a wire bond between the semiconductor device and the pad, and thermally connecting the semiconductor device includes providing the die attach between the semiconductor device and the cap.

* * * * *